United States Patent
Kondo et al.

(10) Patent No.: US 7,074,641 B2
(45) Date of Patent: Jul. 11, 2006

(54) METHOD OF FORMING SILICON-BASED THIN FILM, SILICON-BASED THIN FILM, AND PHOTOVOLTAIC ELEMENT

(75) Inventors: Takaharu Kondo, Kyoto (JP); Shotaro Okabe, Nara (JP); Koichiro Moriyama, Kyoto (JP); Takahiro Yajima, Kyoto (JP); Takeshi Shishido, Nara (JP)

(73) Assignee: Canon Kabushiki Kaisha, Tokyo (JP)

(*) Notice: Subject to any disclaimer, the term of this patent is extended or adjusted under 35 U.S.C. 154(b) by 806 days.

(21) Appl. No.: 10/101,859

(22) Filed: Mar. 21, 2002

(65) Prior Publication Data

US 2005/0227457 A1   Oct. 13, 2005

(30) Foreign Application Priority Data

Mar. 22, 2001 (JP) ............................. 2001-082821
Mar. 18, 2002 (JP) ............................. 2002-075267

(51) Int. Cl.
*H01L 21/20* (2006.01)

(52) U.S. Cl. .................... 438/97; 438/482; 427/574

(58) Field of Classification Search ............ 438/57–98, 438/479–509, 479–50; 427/573–595; 257/E21.115
See application file for complete search history.

(56) References Cited

U.S. PATENT DOCUMENTS

| | | | |
|---|---|---|---|
| 6,103,138 A * | 8/2000 | Kondo ................. 252/62.3 E |
| 6,337,224 B1 | 1/2002 | Okamoto et al. ............. 438/69 |
| 6,488,995 B1 * | 12/2002 | Nishimoto et al. ......... 427/574 |
| 6,620,247 B1 * | 9/2003 | Ebe et al. .................... 118/689 |
| 6,653,165 B1 * | 11/2003 | Kondo et al. ................. 438/73 |
| 6,737,123 B1 * | 5/2004 | Kondo et al. ............... 427/585 |
| 6,794,275 B1 * | 9/2004 | Kondo et al. ............... 438/485 |
| 6,855,621 B1 * | 2/2005 | Kondo et al. ............... 438/513 |
| 6,858,308 B1 * | 2/2005 | Kondo et al. ............... 428/446 |

FOREIGN PATENT DOCUMENTS

JP         7-105354       4/1995
JP        11-330520      11/1999

* cited by examiner

*Primary Examiner*—Savitri Mulpuri
(74) *Attorney, Agent, or Firm*—Fitzpatrick, Cella, Harper & Scinto

(57) ABSTRACT

A method of forming a silicon-based thin film according to the present invention comprises introducing a source gas containing silicon fluoride and hydrogen into a vacuum vessel, and using a high frequency plasma CVD method to form a silicon-based thin film on a substrate introduced into the vacuum vessel, wherein a luminous intensity attributed to SiFα (440 nm) is not smaller than a luminous intensity attributed to Hα (656 nm), thereby providing a photovoltaic element with excellent performance at a low cost as compared with a conventional one, a method of forming a silicon-based thin film with excellent characteristics in a short process cycle time at a further increased film-forming rate, a silicon-based thin film formed by the method, and a photovoltaic element comprising the silicon-based thin film with excellent characteristics, adhesion, and resistance to the environments.

12 Claims, 5 Drawing Sheets

US 7,074,641 B2

METHOD OF FORMING SILICON-BASED THIN FILM, SILICON-BASED THIN FILM, AND PHOTOVOLTAIC ELEMENT

BACKGROUND OF THE INVENTION

1. Field of the Invention

The present invention relates to a method of forming a silicon-based thin film, a silicon-based thin film, and a photovoltaic element such as a solar cell formed by depositing one or more units of pin junctions, a sensor and the like.

2. Related Background Art

A high frequency plasma CVD method is one of excellent methods for mass production of silicon-based thin films in terms of capability of achieving surface area enlargement and low temperature formation and also improving process through-put. Regarding to a solar cell as an example of application of a silicon-based thin film to a product, as compared with existing energy utilizing fossil fuel, a solar cell using a silicon-based thin film has advantages that its energy source is inexhaustible and that its power generation process is clean. In order to make wide use of it, however, a cost has to be reduced. For that, establishment of technology relevant to improvement of a film forming rate using the high frequency plasma CVD method is one of important technological problems to be solved.

Regarding a high frequency plasma CVD method with an increased film forming rate, Japanese Patent Publication No. 7-105354 discloses that, when paying attention to the relation between frequency f of high frequency in a range from 25 to 150 MHz and distance d which is a distance (cm) between a substrate and an electrode, methods carried out in a range of f/d from 30 to 100 MHz/cm are preferable and especially methods carried out in a range of d from 1 to 3 cm and in a range of the pressure from 0.1 to 0.5 mbar are preferable.

Further, regarding a method of forming a crystalline silicon-based thin film, Japanese Patent Application Laid-Open No. 11-330520 discloses that it is possible to carry out growth of a silicon-based thin film at a high film-forming rate under the condition that the reaction chamber contains a silane-based gas and hydrogen gas and has the pressure set at 5 Torr or higher and a distance between a substrate and an electrode is 1 cm or shorter and also discloses a photovoltaic device using the film has a high conversion efficiency.

However, as described above, the former already disclosed high frequency plasma CVD method is a method taking account of the value of f/d, and the former discloses that a high quality film with a high deposition rate and a low defect density can be formed especially when d is small. However, 1 cm is the minimum for the distance d owing to the effect of other phenomena, and technique for high rate film formation for smaller distance is not mentioned. On the other hand, regarding the latter production method, the distance between the deposition face of a substrate and the opposing surface of an electrode is within 1 cm and further the substrate is installed on a discharge electrode and it is a technique limited for batch type formation.

Further, an evaluation of properties of a film for the former is carried out based on evaluation of defect density in mostly a single layer state and no particular description is given regarding damages giving an underlayer and effects on adhesion and resistance to environments in the case of application of the former method to the stacking of the film at the time of device formation. Also, regarding the film itself, it is restricted to amorphous silicon and there is no reference to a film containing crystal phase.

Further, in the case of the latter, the source gases are mainly a silane-based gas and hydrogen gas and the attention is paid only to the flow rate of the silane-based gas and hydrogen gas, and there is no description referring the effect of the residence time defined by the capacity of the discharge space and the flow rates of raw materials gases on the film quality and production of reaction byproducts.

SUMMARY OF THE INVENTION

An object of the present invention is to provide a method of forming a silicon-based thin film having excellent characteristics at a further high film forming rate in a short process cycle time in order to provide a photovoltaic element having excellent performance at a further decreased cost; a silicon-based thin film formed by the method; and a photovoltaic element excellent in characteristics, adhesion, and resistance to environments which is formed by using the silicon-based thin film.

The present invention provides a method of forming a silicon-based thin film, which comprises introducing a source gas containing silicon fluoride and hydrogen introduced into a vacuum vessel, and employing a high frequency plasma CVD method on the substrate introduced into the vacuum vessel to form a silicon-based thin film, wherein a luminous intensity of generated plasma (i.e., intensity of plasma emission) is set such that a luminous intensity attributed to SiFα (440 nm) is not smaller than a luminous intensity attributed to Hα (656 nm). A high frequency introduction part and the foregoing substrate are preferably arranged opposite to each other, and a distance between the high frequency introduction part and the substrate is preferably set to 3 mm or more but 30 mm or less. The pressure in the discharge space is preferably set to 90 Pa (0.68 Torr) or more but $1.5 \times 10^4$ Pa (113 Torr) or less. The residence time τ defined as τ=592×V×P/Q is preferably set to 0.01 seconds or more but 10 seconds or less, where V ($m^3$) denotes a volume of the discharge space where the plasma is generated; Q ($cm^3$/min) denotes a flow rate of the foregoing source gas; and P (Pa) denotes the pressure of the discharge space.

The present invention provides a silicon-based thin film formed on a substrate introduced by introducing a source gas containing silicon fluoride and hydrogen into the vacuum vessel, and using a high frequency plasma CVD method on the substrate introduced into the vacuum vessel, wherein the luminous intensity of generated plasma is set such that luminous intensity attributed to SiFα (440 nm) is not smaller than the luminous intensity attributed to Hα (656 nm). A high frequency introduction part and the foregoing substrate are preferably arranged opposite to each other, and the distance between the high frequency introduction part and the substrate is preferably set to 3 mm or more but 30 mm or less. The pressure in the discharge space is preferably set to 90 Pa (0.68 Torr) or more but $1.5 \times 10^4$ Pa (113 Torr) or less. The residence time τ defined as τ=592×V×P/Q is preferably se to 0.01 seconds or more but 10 seconds or less, wherein V ($m^3$) denotes a volume of the discharge space where the plasma is generated; Q ($cm^3$/min) denotes a flow rate of the foregoing source gas; and P (Pa) denotes a pressure of the discharge space.

The present invention provides a photovoltaic element comprising semiconductor layers having at least one pair of pin junction on a substrate, at least one i-type semiconductor layer of the photovoltaic element is a silicon-based thin film formed by introducing a source gas containing silicon fluoride and hydrogen into a vacuum vessel, and using a high frequency plasma CVD method on the substrate introduced into the vacuum vessel, wherein the silicon-based thin film is formed in a manner that the luminous intensity of generated plasma is set such that the luminous intensity attributed to SiFα (440 nm) is not smaller than the luminous intensity attributed to Hα (656 nm). A high frequency introduction part and the foregoing substrate are preferably arranged opposite to each other, and the distance between the high frequency introduction part and the substrate is preferably set to 3 mm or more but 30 mm or less. The pressure in the discharge space is preferably set to 90 Pa (0.68 Torr) or more but $1.5 \times 10^4$ Pa (113 Torr) or less. The residence time τ defined as τ=592×V×P/Q is preferably set to 0.01 seconds or more but 10 seconds or less, wherein V ($m^3$) denotes a volume of the discharge space where the plasma is generated; Q ($cm^3$/min) denotes a flow rate of the foregoing source gas; and P (Pa) denotes the pressure of the discharge space.

High frequency density A/B value is preferably in a range from 0.05 to 2 W/$cm^3$, where A (W) denotes an introducing power of high frequency and B ($cm^3$) denotes a product of a surface area of a high frequency introduction part and a distance between the high frequency introduction part and the substrate. The luminous intensity of the foregoing plasma is preferably adjusted so that the luminous intensity attributed to SiFα (440 nm) is not smaller than the luminous intensity attributed to Hα (656 nm). The luminous intensity of the foregoing plasma is preferably adjusted so that the ratio of the luminous intensity attributed to SiFα (440 nm) and the luminous intensity attributed to Hα (656 nm) is a predetermined intensity ratio. The foregoing source gas preferably contains a silicon hydride compound. The foregoing silicon-based thin film is preferably a silicon-based thin film containing a microcrystal with Scherrer radius of 20 nm or larger as a crystal grain size. The foregoing silicon-based thin film preferably has the Raman scattering intensity attributed to the crystal component at least three times as high as the Raman scattering intensity attributed to the amorphous component. The foregoing silicon-based thin film preferably has 70% or higher ratio of the diffraction intensity of (220) by X-ray or electron beam diffraction to the entire diffraction intensity.

DESCRIPTION OF THE PREFERRED EMBODIMENTS

Figure 1:
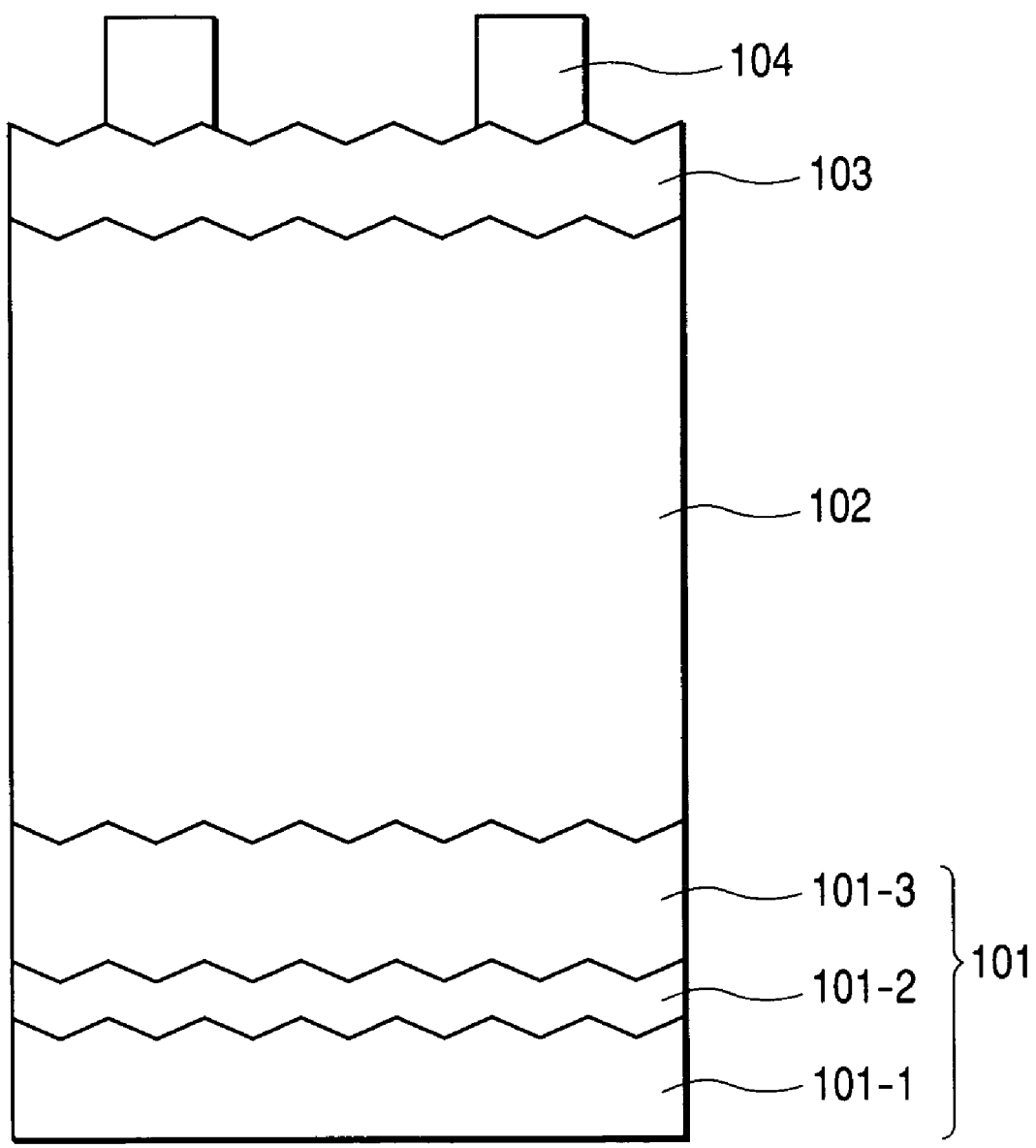
FIG. 1 is a schematic sectional view showing one example of a photovoltaic element of the present invention.

In order to solve the above-described problems, inventors of the present invention have enthusiastically made investigations and consequently found that it is possible to form a silicon-based thin film with a scarce defective density, a high crystallinity, and an excellent orientation property at a further increased film forming rate by a method of forming a silicon-based thin film, which comprises introducing a source gas containing a silicon fluoride and hydrogen into a vacuum vessel, and employing a high frequency plasma CVD method on a substrate introduce into the vacuum vessel, wherein the silicon-based thin film is formed under the conditions that a part of a discharge space where plasma is generated is covered with at least a part of the foregoing substrate, that a high frequency introduction part and the foregoing substrate are arranged opposite to each other, that the distance of the foregoing high frequency introduction part and the foregoing substrate is 3 mm or more but 30 mm or less, that the pressure in the discharge space is 90 Pa (0.68 Torr) or more and $1.5 \times 10^4$ Pa (113 Torr) or less, that the residence time τ defined as τ=592×V×P/Q, is 0.01 seconds or more but 10 seconds or less, wherein V ($m^3$) denotes the capacity of the discharge space where the plasma is generated, Q ($cm^3$/min (normal)) denotes the flow rate of the foregoing source gas, and P (Pa) denotes the pressure of the discharge space, and the luminous intensity attributed to SiFα (440 nm) of the luminous intensity of the foregoing plasma is not smaller than the luminous intensity attributed to Hα (656 nm); and also found that it is possible to produce a photovoltaic element having a high photoelectric conversion efficiency, good adhesion, and excellent resistance to the environments at a low cost by using the foregoing silicon-based thin film for at least a part of at least one i-type semiconductor layer in the photovoltaic element comprising semiconductor layers having at least one pair of pin junction on a substrate.

The following effects can be achieved by the above-described constitutions.

The method for forming a crystal phase-containing silicon-based thin film by plasma CVD method using high frequency is capable of shortening the process time and lowering the process temperature as compared with a solid phase reaction and therefore is advantageous in the cost down. Especially, in a photovoltaic element having pin junction(s), application of the method to formation of an i-type semiconductor layer with a large film thickness is made the above effect greatly effective. Especially, it is preferable that an i-type semiconductor layer is formed at a film forming rate of 2.0 nm/second or more.

In the case where the foregoing silicon-based thin film, particularly an i-type semiconductor layer substantially functioning as a light-absorbing layer in a photovoltaic element having pin junction(s), is a crystal phase-containing i-type semiconductor layer, the photodegradation phenomenon attributed to the Staebler-Wronski effect, which is problematic in the case of an amorphous film, can be suppressed.

On the other hand, as a problem in the case a crystal phase-containing silicon-based thin film is employed for an i-type semiconductor layer, it is known that the crystal grain boundaries affect both a major carrier and a minority carrier to deteriorate the capabilities. In order to suppress the effects of the crystal grain boundaries, it is supposed to be one of effective means that the crystal grain size in the i-type semiconductor layer is enlarged to lower the density of the crystal grain boundaries. Especially, the crystal grain size is preferably large in the carrier moving direction and the Scherrer radius is preferably 20 nm or more if the carrier moving direction is set to be a plane normal line.

To increase the orientation property can be used as the means for enlarging the crystal grain size. In the case film deposition proceeds in random crystal orientation, it can be assumed that the respective crystal grains come into collision against one another during the growth to result in relatively small grain size and therefore, by orienting the crystal grains in a specified direction and making the growth direction even, the random collision of the crystal grains can be suppressed and as a result it is supposed to be possible to enlarge the crystal grain size. Also, in a crystalline silicon having a diamond structure, since (220) plane has the highest in-plane atomic density and a silicon atom in the outermost growing surface has a structure where three bonds among four bonds are bonded by covalent bonding with other silicon atoms, in the case the plane is set to be a growing plane, a silicon-based thin film excellent in the adhesion and weathering resistance is supposed to be formed and therefore it is preferable. Based on an ASTM card, in the case of a non-oriented crystalline silicon, the ratio of the diffraction intensity of the (220) plane to the entire diffraction intensity of 11 reflections from a low angle side is about 23%, and the structure having the ratio of the diffraction intensity of the (220) plane exceeds 23% has the orientation property in this plane direction. Especially in a structure having 70% or more of the ratio of the diffraction intensity of the (220) plane, the above-described effect is more reinforced and therefore it is further preferable. Also, taking account of suppressing the photodegradation phenomenon due to Staebler-Wronski effect and decrease of the density of crystal grain boundaries, the inventors have enthusiastically made investigations and consequently found it is preferable that the Raman scattering intensity (of typically 520 cm$^{-1}$ vicinity) attributed to the crystal component is at least three times as high as the Raman scattering intensity (of typically 480 cm$^{-1}$ vicinity) attributed to the amorphous component.

In the method of forming a silicon-based thin film, which comprises introducing a source gas containing a silicon fluoride and hydrogen into a vacuum vessel, and employing a high frequency plasma CVD method on the substrate introduced into the vacuum vessel, it is supposed to be made possible that the plasma density per unit discharge space volume is increased and that the reactive species contributing to the deposited film formation are produced at a high density by making the distance between the high frequency introduction part and the substrate narrow, whereby the film forming rate can further be accelerated.

On the other hand, if the distance between the high frequency introduction part and the substrate is narrowed, it is supposed that the electron density in the plasma increases and following that, the ion generation amount increases. Since ion is accelerated by electrostatically attracting force in a sheath region in the discharge space, ion is supposed to be causes of the strain in the atom arrangement of the bulk by ion impact and formation of voids in the film, thereby resulting in a hindrance to a high quality silicon-based thin film formation, decrease of adhesion to an underlayer and the deterioration of the resistance to the environments. In this case, it is supposed to be possible that increase of the pressure in the film forming space increases the chances of collision of the ion in the plasma against other ions and active species to result in decrease of the impact force of the ion and the amount of the ion itself and therefore it can be expected that the ion impact is decreased relatively. Meanwhile, if the pressure is increased further, the plasma is converged on the periphery of the high frequency introduction part to make it difficult to increase the uniformity when a silicon-based thin film with a large surface area is formed.

Here, in the high frequency plasma CVD method using a source gas containing silicon fluoride and hydrogen as a source gas, active species such as $SiF_nH_m$ ($0 \leq n$, $m \leq 4$), HF, F, H and the like are supposed to be produced. The plasma atmosphere containing these active species supposedly has a feature that in addition to the active species contributing to the deposition of a silicon-based thin film, there exist active species contributing to the etching. Hence, formation of a silicon-based thin film with a scarce amorphous region and a high crystallinity degree is probably made possible since film deposition is carried out while Si—Si bonds with a relatively weak bonding force in the film surface being etched. Further, during the etching process, since radicals are formed by disconnection of the bonds and the structure moderation is promoted, it is supposed to be possible that a high quality silicon-based thin film is formed at a further low process temperature.

Here, in the high frequency plasma CVD method using a source gas containing silicon fluoride and hydrogen as a source gas, high rate film formation is supposed to be made possible by generating hydrogen-containing fluorinated silane-based active species such as $SiF_2H$, $SiFH_2$ and the like by adding hydrogen to the silicon fluoride. In order to generate the foregoing hydrogen-containing fluorinated silane-based active species such as $SiF_2H$, $SiFH_2$ and the like, formation of SiF by efficiently decomposing silicon fluoride is important and further active reaction process of the formed SiF and activated hydrogen is supposed to be important. Especially, sufficient existence of SiF in the plasma is supposed to be particularly important.

In order to carry out formation of a silicon-based thin film with the orientation property and the crystalline degree as described above at a totally high film forming rate while etching being carried out simultaneously with the deposition, control of the plasma process becomes an important technological matter. In this case, in order to carry out active reaction process of SiF and the activated hydrogen, as described above, it is important to increase the plasma density per unit discharge space volume, and in order to generate a larger quantity of the activated hydrogen in the plasma atmosphere where electron density is increased, a source gas is required to be introduced so as to suppress hydrogen molecule depletion. Further, in the case the density of the radicals such as SiH and $SiH_2$ is increased in the plasma, the crystallization using them as nuclei is easy to take place in the discharge space and on the deposited film surface and it results in formation of reaction byproducts such as polysilane and inhibition to crystal grin size enlargement and therefore, it is also required to suppress the density of radicals such as SiH and $SiH_2$. To satisfy these matters, it is supposed to be effective to actively supply a new source gas while promoting decomposition of the source gas and actively carry out secondary reaction for accelerating elimination of radicals such as SiH and $SiH_2$.

By considering the residence time $\tau$ (second) defined as $\tau = 592 \times V \times P/Q$ wherein, as parameters of the plasma, V (m$^3$) denotes the capacity of the discharge space where the plasma is generated; Q (cm$^3$/min (normal)) denotes the flow rate of the foregoing source gas; and P (Pa) denotes the pressure of the discharge space and the luminous intensity of the plasma as plasma control parameters, generation of plasma with a desired plasma atmosphere is supposed to be made possible. In order to obtain a high quality silicon-based thin film, in addition to the above-described parameters of the distance between the high frequency introduction part and the substrate and the pressure, control of the residence time and the luminous intensity of the plasma is supposed to be important.

Taking the above-described matter into consideration, the inventors have enthusiastically made investigations and consequently found that, in the case of forming a silicon-based thin film with a scarce defective density and excellent characteristics at a further high film forming rate, the density of radicals such as SiH, SiH$_2$ and the like can be suppressed and a desired silicon-based thin film can be formed, when the luminous intensity of the plasma in the periphery of the foregoing substrate is within a region where the luminous intensity attributed to SiFα (440 nm) is not lower than the luminous intensity attributed to Hα (656 nm).

Incidentally, the control of the luminous intensity is carried out depending on the plasma generation apparatus employed and, for example, it may be carried out by the mixing ratio of SiF$_4$ gas and H$_2$ gas in the source gas, the high frequency power density, the residence time of the source gas and the like. Further, in the substrate periphery, it is sufficient that the luminous intensity attributed to SiFα (440 nm) is not lower than the luminous intensity attributed to Hα (656 nm).

In this case, the distance of the high frequency introduction part and the substrate is preferably 3 mm or more but 30 mm or less, the pressure in the discharge space is preferably 90 Pa (0.68 Torr) or more but $1.5 \times 10^4$ Pa (113 Torr) or less, and the residence time τ defined as $\tau = 592 \times V \times P/Q$ is preferably 0.01 seconds or more but 10 seconds or less, wherein V (m$^3$) denotes the capacity of the discharge space where the plasma is generated; Q (cm$^3$/min (normal)) denotes the flow rate of the foregoing source gas; and P (Pa) denotes the pressure of the discharge space.

If the distance between the substrate and the high frequency introduction part is shorter than 3 mm, even and stable plasma is difficult to be retained continuously and if it is longer than 30 mm, active reaction of SiF and activated hydrogen is difficult to be caused.

A formation method by a CVD method using high frequency with the frequency of 1 MHz to 300 MHz is particularly preferable. With the frequency in this range, decomposition and reaction process of the gas containing silicon fluoride is sufficiently carried out. More preferably, the range is from 10 MHz to 300 MHz.

Further, by introducing the high frequency so as to control high frequency density A/B value, where A (W) denotes the introducing power of high frequency and B (cm$^3$) denotes a product of the surface area of the high frequency introduction part and the distance between the high frequency introduction part and the substrate, to be in a range from 0.05 to 2 W/cm$^3$, the effect of eliminating the radicals such as SiH, SiH$_2$, and the like is further enhanced, so that formation of a silicon-based thin film with a higher crystallinity and an excellent orientation property is made possible. It is supposedly attributed to that the structure moderation is promoted by generation of a large quantity of activated hydrogen to result in crystallinity improvement and that orienting bonds with weak bonding force are disconnected by the passivation function to result in the orientation property improvement.

Further, by adjusting the luminous intensity of the plasma in the substrate periphery so that the luminous intensity attributed to SiFα (440 nm) and the luminous intensity attributed to Hα (656 nm) has a predetermined intensity ratio, a silicon-based thin film having desired characteristics can be formed with a high reproducibility and therefore it is preferable. In this case, as the desired predetermined value, the value of (the luminous intensity attributed to SiFα (440 nm))/(the luminous intensity attributed to Hα (656 nm)) is preferably 1 or more and more preferably 3 or more.

Further, at the time of producing a device such as a photovoltaic element, in the above-described range, deformation of the components, the film quality, and the characteristics of the underlaying layer by reducing function of hydrogen or the like in the plasma atmosphere can be suppressed and bad effects on the underlaying layer can be eliminated. In the case a transparent conductive film of an oxide of a metal such as zinc oxide is employed as the underlaying layer, decrease of the transmittance of the transparent conductive film and deterioration of the characteristics of the photovoltaic element following that can be prevented and therefore it is particularly effective.

Further, as another function, the adhesion of the silicon-based thin film to the underlaying layer is improved. Such an effect is supposedly attributed to that deposited film formation is carried out while the stress strain in the periphery of the surface being constantly moderated by active surface diffusion of SiF$_2$H, SiFH$_2$ radicals. Further, it is supposed that since the hydrogen partial pressure is increased relatively, the passivation effect on the crystal grain boundaries is increased and inactivation of the crystal grain boundaries is promoted and further sweeping isolation of hydrogen atoms incorporated into silicon network is suppressed to result in prevention of plastic fluidity attributed to formation of irregular regions in the silicon network and prevention of cracks and coagulation following that, and therefore, it is made possible to form a silicon-based thin film excellent in the film quality and the adhesion and to provide a photovoltaic element excellent in the resistance to the environments by incorporating the silicon-based thin film into.

Taking the effect on the underlaying layer and the effectiveness on the adhesion, the resistance to the environments, and decrease of the photodegradation ratio into consideration, the preferable ranges of the pressure and the residence time are 100 Pa (0.75 Torr) or more but 5,000 Pa (37.5 Torr) or less, and 0.2 seconds or more but 3 seconds or less, respectively.

Hereinafter, the constituent elements of a photovoltaic element of the present invention will be described.

FIG. 1 is a schematic sectional view showing one example of a photovoltaic element of the present invention. In the figure, the reference numeral 101 denotes a substrate, the reference numeral 102 denotes a semiconductor layer, the reference numeral 103 denotes a second transparent conductive layer, and the reference numeral 104 denotes a current collector electrode. Further, the reference numeral 101-1 denotes a base member, the reference numeral 101-2 denotes a metal layer, and the reference numeral 101-3 denotes a first transparent conductive layer. The members 101-1, 101-2 and 101-3 are constituent members of the substrate 101.

(Base Member)

As the base member 101-1, a plate-like member and a sheet-like member made of a metal, a resin, glass, a ceramic, a semiconductor bulk and the like are preferably used. The surface may be finely uneven. A transparent base member may be used so as to introduce light from the base member side. Further, by shaping the base member in an elongnat form, a continuous film formation by a roll-to-roll method is made possible. A material having flexibility such as a stainless, a polyimide and the like is particularly suitable as the material for the base member 101-1.

(Metal Layer)

The metal layer 101-2 functions as an electrode and also as a reflection layer for reflecting light reaching the base member 101-1 to reuse it in the semiconductor layer 102. As the material for the layer, Al, Cu, Ag, Au, CuMg, AlSi and the like are preferable to be used. As its formation method, evaporating, sputtering, electrodepositing, and printing methods are preferable. The metal layer 101-2 is preferable to have an uneven surface. Owing to that, the optical path of the reflected light in the semiconductor layer 102 can be prolonged and short-circuiting current can be increased. If the base member 101-1 has conductivity, the metal layer 101-2 may not be formed.

(First Transparent Conductive Layer)

The first transparent conductive layer 101-3 has a role of increasing irregular reflection of incident light and reflected light and prolonging the optical path in the semiconductor layer 102. Further, it has a role of preventing diffusion or migration of the element of the metal layer 101-2 to the semiconductor layer 102 and occurrence of shunt of the photovoltaic element. Moreover, when it has a proper resistance, it has a role of preventing short-circuit due to defects such as pin holes of the semiconductor layer. Furthermore, the first transparent conductive layer 101-3, similar to the metal layer 101-2, preferably has an uneven surface. The first transparent conductive layer 101-3 is preferably made of a conductive oxide such as ZnO, ITO and the like and preferably formed by evaporating, sputtering, CVD, and electrodepositing methods. A substance for changing the conductivity may be added to these conductive oxides.

Also, as the method of forming a zinc oxide layer, sputtering method, electrodepositing method and combination of these methods are preferable.

The conditions for forming a zinc oxide film by a sputtering method are greatly affected by methods, types and flow rates of gases, the internal pressure, the applied electric power, the film forming rate, the substrate temperature and the like. For example, in the case a zinc oxide film is formed using a zinc oxide target by a DC magnetron sputtering method, Ar, Ne, Kr, Xe, Hg, and $O_2$ may be used as the types of gases. Although the flow rate depends on the size of the apparatus and the gas discharge speed, for example, in the case the volume of the film formation space is 20 litter, it is preferable to be from 1 sccm to 100 sccm. At the time of film formation, the internal pressure is preferably $1\times10^{-4}$ Torr to 0.1 Torr. Although depending on the size of the target, the applied electric power is preferably from 10 W to 100 KW when the diameter of the target is 15 cm. Although the preferable range of the substrate temperature differs depending on the film forming rate, when film formation is carried out at 1 μm/h, it is desirable to be from 70° C. to 450° C.

Also, the conditions of forming the zinc oxide film by the electrodepositing method, an aqueous solution containing nitrate ion and zinc ion is preferable to be used in a corrosion resistant container. The nitrate ion and zinc ion are preferably within a range from 0.001 mol/L to 1.0 mol/L, more preferably within a range from 0.01 mol/L to 0.5 mol/L, and furthermore preferably within a range from 0.1 mol/L to 0.25 mol/L. The supply sources of nitrate ion and zinc ion are not particularly restricted. Zinc nitrate, which is a supply source of both ions, and mixtures of a water soluble nitric acid salt such as ammonium nitrate as a supply source of nitrate ion and a zinc salt such as zinc sulfate as a supply source of zinc ion may be used. Further, addition of a hydrocarbon to such an aqueous solution is preferable in order to suppress abnormal growth and improve the adhesion. The types of the hydrocarbon are not particularly restricted, yet monosaccharides such as glucose, fructose and the like; disaccharides such as maltose, saccharose and the like; polysaccharides such as dextrin and starch and the like; and their mixture may be employed. Although depending on the types of the hydrocarbon, the amount of the hydrocarbon in the aqueous solution is, in general, preferably within a range from 0.001 g/L to 300 g/L, more preferably within a range from 0.005 g/L to 100 g/L, and furthermore preferably within a range from 0.01 g/L to 60 g/L. In the case of depositing the zinc oxide film by the electrodepositing method, it is preferable to use the base member as a cathode to deposit a zinc oxide film thereon, and to use zinc, platinum, or carbon as an anode in the foregoing aqueous solution. In this case, the density of the electric current flowing through a load resistance is preferably from 10 mA/dm$^2$ to 10 A/dm$^2$.

(Substrate)

By the above-described methods, a substrate 101 is formed by stacking the metal layer 101-2 and the first transparent conductive layer 101-3, based on the necessity, on the base member 101-1. Further, in order to make integration easy, an insulating layer may be formed as an intermediate layer on the substrate 101.

(Semiconductor Layer)

Si is used as a main material of a semiconductor layer 102 a part of which is made of the silicon-based thin film of the present invention. In place of Si, alloys of Si with C or Ge may be used. The semiconductor layer 102 also contains hydrogen and/or halogen atom. The preferable content of them is 0.1 to 40 atomic %. The semiconductor layer 102 may further contain oxygen, nitrogen and the like. The Group III elements may be added to a semiconductor layer so as to form a p-type semiconductor layer, or the Group V elements may be added to a semiconductor layer so as to form an n-type semiconductor layer. The electric characteristics of the p-type layer and the n-type layer are preferable to have 0.2 eV or lower activation energy and most preferable to have 0.1 eV or lower. As the specific resistance, 100 Ωcm or lower is preferable and 1 Ωcm or lower is most preferable. In the case of a stack cell (a photovoltaic element comprising a plurality of pin junctions), the i-type semiconductor layer of the pin junctions near the light entering side is preferable to have a wide band gap and the band gap is preferable to become narrower as the pin junctions are remoter from the light entering side. A crystalline semiconductor with low light absorption or a semiconductor with a wide band gap is suitable for the doped layer (a p-type layer or an n-type layer) on the light entering side.

As an example of the stack cell in which two pairs of pin junctions are stacked, the stack cell comprising (an amorphous silicon semiconductor layer, an amorphous silicon semiconductor layer), (an amorphous silicon semiconductor layer, an amorphous silicon germanium semiconductor layer) from the light entering side as the combination of the i-type silicon-based semiconductor layer can be exemplified. Also, as an example of a photovoltaic element in which three pairs of pin junctions are stacked, the stack cell comprising (an amorphous silicon semiconductor layer, an amorphous silicon semiconductor layer, an amorphous silicon germanium semiconductor layer), (an amorphous silicon semiconductor layer, an amorphous silicon germanium semiconductor layer, an amorphous silicon germanium semiconductor layer) from the light entering side as the combination of the i-type silicon-based semiconductor layer can be exemplified. The i-type silicon-based semiconductor layer preferably has an absorption coefficient (α) of light (630 nm) of $10\times10^{-6}$ S/cm or lower of 5000 cm$^{-1}$ or higher, a photoconductivity (σp) by solar simulator light radiation from a solar simulator (AM 1.5; 100 mW/cm$^2$), and an Urback energy of 55 meV or lower by a contact photocurrent method (CPM). As the i-type semiconductor layer, the layer having slightly p-type or n-type conductivity may be used. Further, in the case a silicon germanium semiconductor layer is used for the i-type semiconductor layers, for the purpose of decreasing the interface energy level and increasing the open voltage, an i-type semiconductor layer containing no germanium may be inserted into at least one of the p/i interface and the n/i interface.

Figure 3:
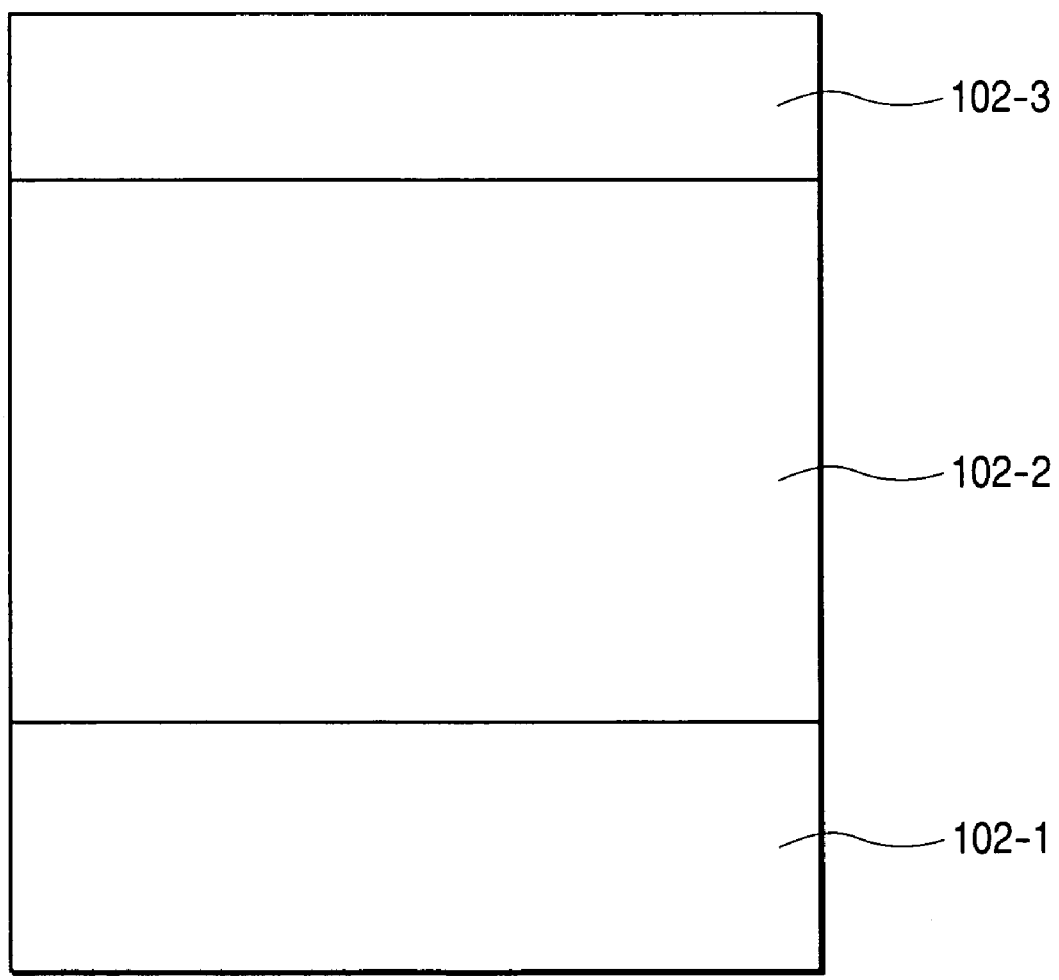
FIG. 3 is a schematic sectional view showing one example of a semiconductor layer of the present invention.

The following is further description for the semiconductor layer 102 as a constituent element of the present invention. FIG. 3 is a schematic sectional view showing a semiconductor layer 102 having one pair of pin junction as one example of a semiconductor layer of the present invention. In the figure, reference numeral 102-1 denotes a semiconductor layer having a first conductivity type and an i-type semiconductor layer 102-2 of a silicon-based thin film of the present invention, and a semiconductor layer 102-3 having a second conductivity type are stacked thereon. In the case of semiconductor layers having a plurality of pin junctions, it is preferable that at least one of them has the above-described structure.

(Method of Forming Semiconductor Layer)

To form a silicon-based thin film of the present invention and a semiconductor layer 102, a high frequency plasma CVD method is suitable. Hereinafter, preferable procedure for forming the semiconductor layer 102 by the high frequency plasma CVD method will be exemplified.

(1) A vacuum vessel for semiconductor formation capable of keep its inside in a reduced pressure state is reduced to a deposition pressure.
(2) Material gases such as source gases and dilution gases are introduced into a deposition chamber and while the deposition chamber being evacuated by a vacuum pump, the inside of the deposition chamber is set to be the deposition pressure.
(3) A substrate 101 is set to be at a predetermined temperature by a heater.
(4) High frequency oscillated by a high frequency power source is introduced into the foregoing deposition chamber. A method of guiding high frequency through a waveguide and introducing the high frequency into the deposition chamber through a dielectric window of quartz, alumina, aluminum nitride and the like in the case the high frequency is microwave, and a method of guiding high frequency through a coaxial cable and introducing the high frequency into the deposition chamber through a metal electrode in the case the high frequency is VHF or RF can be employed as the introduction method into the foregoing deposition chamber.
(5) Source gases are decomposed by generating plasma in the deposition chamber, and a deposited film is formed on the substrate 101 disposed in the deposition chamber. The procedure is repeated a plurality of times, based on the necessity, to form the semiconductor layer 102.

As the formation conditions of the semiconductor layer 102, the following conditions are preferable: the substrate temperature in the deposition chamber is in a range from 100 to 450° C.; the pressure is in a range from 0.067 Pa (0.5 mTorr) to $1.5 \times 10^4$ Pa (113 Torr); and the high frequency power density is in a range from 0.001 to 2 W/cm$^3$. Further, in the case of forming the silicon-based thin film of the present invention, the following are preferable: the distance of the high frequency introduction part and the foregoing substrate is 3 mm or more but 30 mm or less: the pressure in the discharge space is 90 Pa (0.68 Torr) or more but $1.5 \times 10^4$ Pa (113 Torr) or less: the residence time τ defined as τ=592×V×P/Q wherein V (m$^3$) denotes the capacity of the discharge space is 0.01 seconds or more but 10 seconds or less, where the plasma is generated, Q (cm$^3$/min) denotes the flow rate of the foregoing source gas, and P (Pa) denotes the pressure of the discharge space: and the luminous intensity of plasma in the periphery of the substrate is set so that the luminous intensity attributed to SiFα (440 nm) is not smaller than the luminous intensity attributed to Hα (656 nm). Further, as the high frequency power density, a range from 0.05 to 2 W/cm$^3$ is a preferable condition.

Source gases suitable for forming the silicon-based thin film of the present invention and the semiconductor layer 102 are silicon fluoride such as $SiF_4$, $SiH_2F_2$, $SiH_3F$, $Si_2F_6$, and the like; silicon hydride compounds such as $SiH_4$, $Si_2H_6$, and the like; and in the case of forming alloy-based layers, a gasified compound containing Ge or C such as $GeH_4$ or $CH_4$ is preferable to be introduced while being diluted with hydrogen gas. Further, an inert gas such as He may be added. Further, a gasified compound containing nitrogen or oxygen may be added as source gases and the diluting gas. As a dopant gas for forming the semiconductor layer into a p-type layer, $B_2H_6$, $BF_3$ and the like can be employed. In addition, as a dopant gas for forming the semiconductor layer into an n-type layer, $PH_3$, $PF_3$ and the like can be employed. In the case of depositing a crystal phase thin film, or a layer of such as SiC with scarce light absorption or a wide band gap, the ratio of the diluting gas to the source gases is preferable to be increased and high frequency with relatively high power density is preferable to be introduced.

(Second Transparent Conductive Layer)

The second transparent conductive layer 103 is an electrode in the light entering side and at the same time also functions as an antireflection film by properly setting the film thickness. The second transparent conductive layer 103 is required to have a high transmittance in a region of wavelength which the semiconductor layer 102 can absorb and a low resistance. The transmittance at 550 nm is preferably 80% or higher and more preferably 85% or higher. The resistance is preferably $5 \times 10^{-3}$ Ωcm or lower and more preferably $1 \times 10^{-3}$ Ωcm or lower. As the material for the second transparent conductive layer 103, ITO, ZnO, $In_2O_3$ and the like are preferable to be used. As a formation method of the layer, evaporation, CVD, spraying, spin-on, and immersion methods are suitable. A substance for changing the conductivity may be added to these materials.

(Current Collecting Electrode)

The current collecting electrode 104 is formed on the transparent electrode 103 in order to improve the current collecting efficiency. As a method for forming it, a method for forming a metal with an electrode pattern by sputtering using a mask, a method for printing a conductive paste or a solder paste, a method for fixing a metal wire with a conductive paste and the like are preferable.

Incidentally, in some cases, protection layers may be formed on both faces of the photovoltaic element based on the necessity. Simultaneously, a reinforcing material such as a steel sheet and the like may be used together in the back face (on the opposing side to the light entering side) of the photovoltaic element.

In the following examples, the present invention will be described specifically while exemplifying solar cells as the photovoltaic element, however the present invention is not intended to be limited to these examples at all.

EXAMPLE 1

Figure 2:
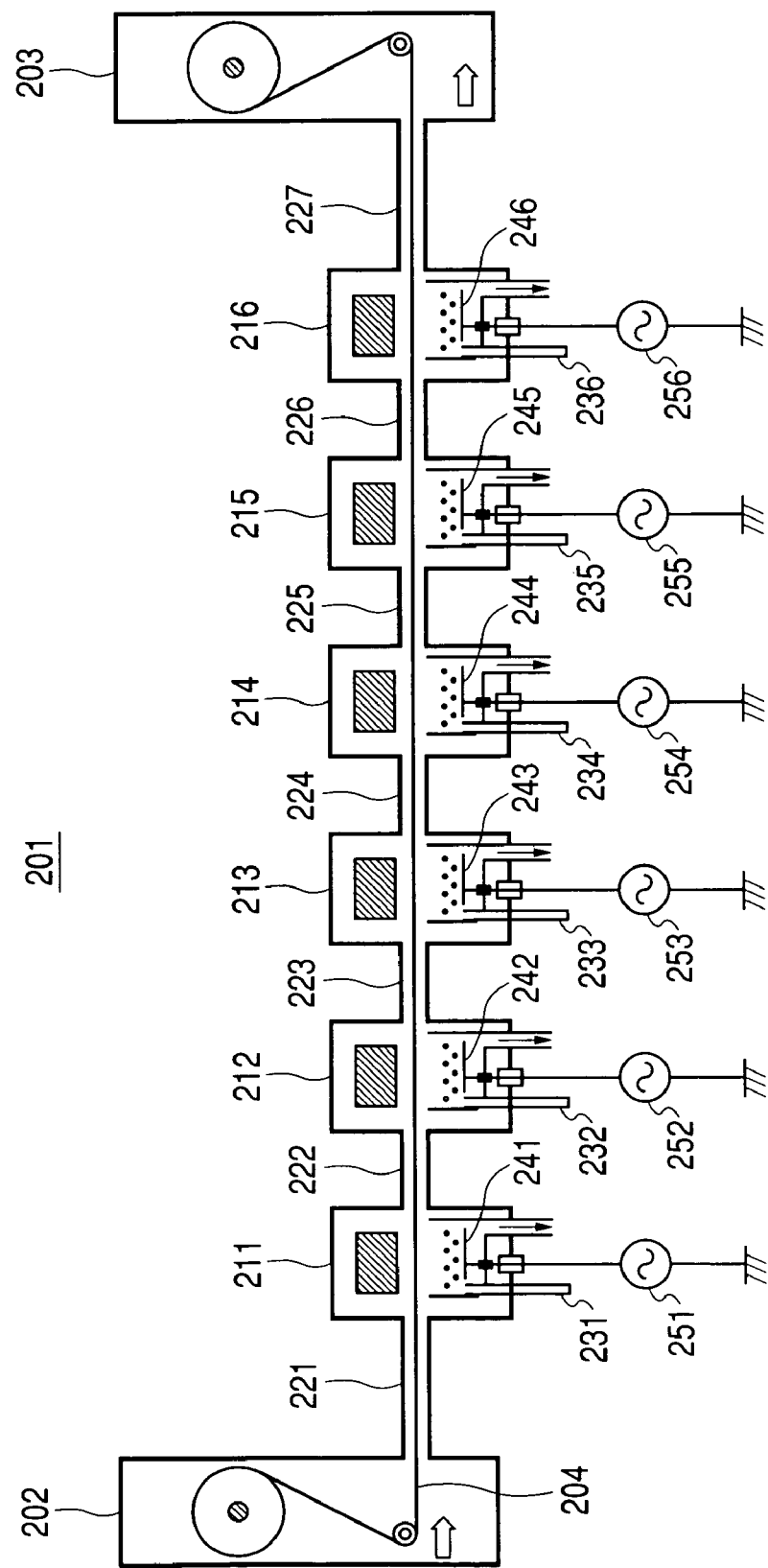
FIG. 2 is a schematic sectional view showing one example of a deposited film forming apparatus for producing a silicon-based thin film and a photovoltaic element of the present invention.
Figure 4:
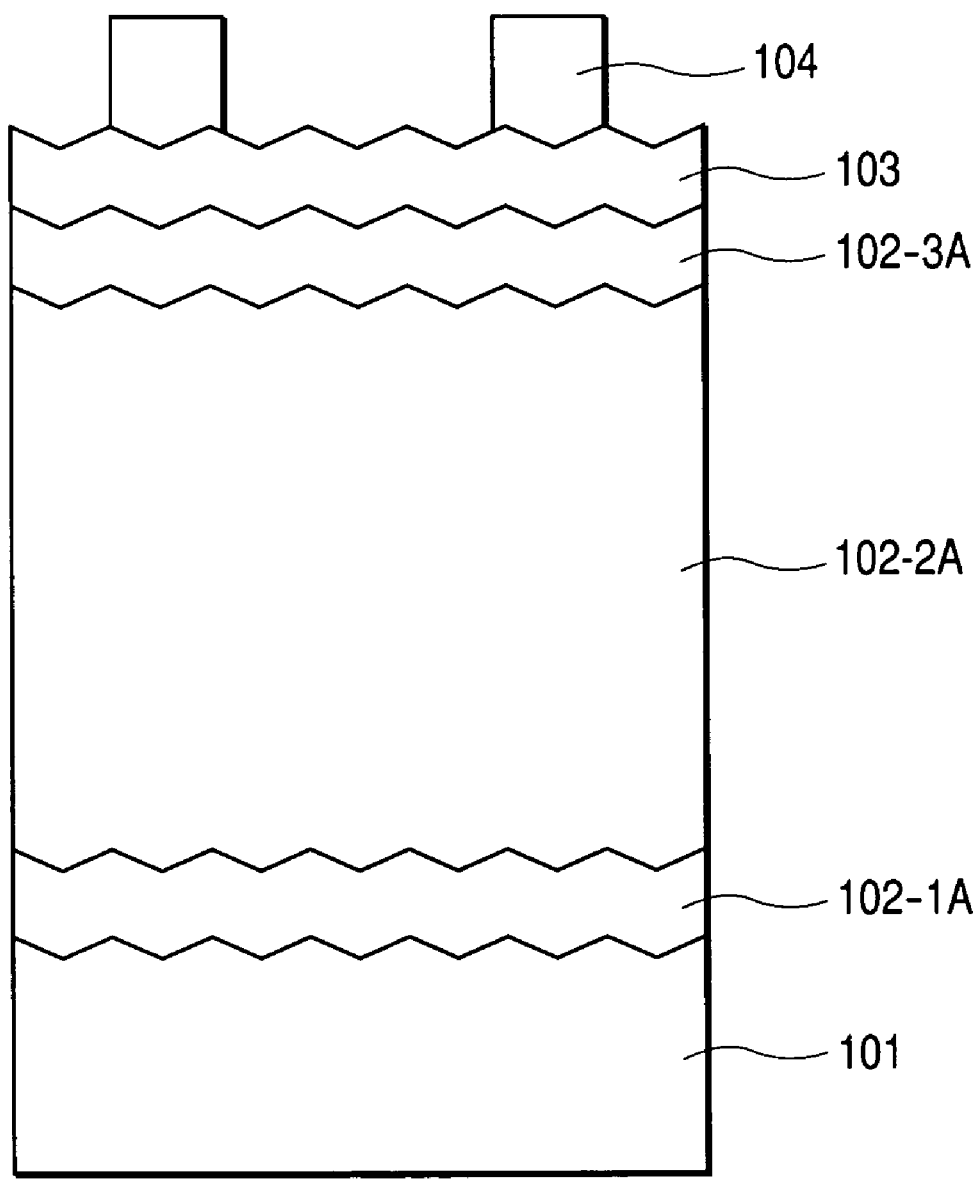
FIG. 4 is a schematic sectional view showing one example of a photovoltaic element containing a silicon-based thin film of the present invention.

Using a deposited film forming apparatus 201 illustrated in FIG. 2, a photovoltaic element illustrated in FIG. 4 was produced by the following procedure. FIG. 4 is a schematic sectional view showing one example of a photovoltaic element comprising a silicon-based thin film of the present invention. In the figures, the same reference characters denotes the same members as in FIG. 1 and their descriptions are omitted. The semiconductor layer of the photovoltaic element was composed of an amorphous n-type semiconductor layer 102-1A, a microcrystalline i-type semiconductor layer 102-2A, and a microcrystalline p-type semiconductor layer 102-3A. That is, the photovoltaic element was so-called a pin-type single cell photovoltaic element.

FIG. 2 is a schematic sectional view showing one example of a deposited film forming apparatus for producing the silicon-based thin film and the photovoltaic element of the present invention. The deposited film forming apparatus 201 illustrated in FIG. 2 comprises a substrate wind-off vessel 202, semiconductor formation vacuum vessel 211 to 216, and a substrate wind-up vessel 203 which are connected through gas gates 221 to 227. In the deposited film forming apparatus 201, a belt-like conductive substrate 204 is to be set penetrating the respective vessels and the respective gas gates. The belt-like conductive substrate 204 is wound off a bobbin installed in the substrate wind-off vessel 202 and wound up on another bobbin in the substrate wind-up vessel 203.

The semiconductor formation vacuum vessels 211 to 216 each have a deposition chamber for forming a plasma generation region. Each deposition chamber is composed so as to restrict the discharge spaces, where plasma is generated, in the vertical direction with the foregoing conductive substrate 204 and the foregoing high frequency introduction part, and restrict in the transverse direction with discharge plates so arranged as to surround each of high frequency introduction parts 241 to 246. Also, observation windows of quartz glass are formed in order to detect light emission in the periphery of the substrate.

High frequency electric power is applied from high frequency power sources 251 to 256 to the plate-like high frequency introduction parts 241 to 246 in the deposition chambers to generate glow discharge and consequently decompose the source gases to deposit a semiconductor layer on the conductive substrate 204. The high frequency introduction parts 241 to 246 are arranged opposite to the conductive substrate 204 and equipped with height adjustment mechanisms not shown in the drawings. By the foregoing height adjustment mechanisms, the distance between the conductive substrate and each high frequency introduction part is made changeable and the volume of each discharge space is made simultaneously changeable. Further, gas introduction pipes 231 to 236 to introduce source gases and a diluting gas are connected to the respective semiconductor formation vacuum vessels 211 to 216.

The deposited film forming apparatus 201 illustrated in FIG. 2 comprises six semiconductor formation vacuum vessels, in the following examples, it is no need to generate glow discharge in all of the semiconductor formation vacuum vessels and the generation of the glow discharge in the respective vessels can be selected corresponding to the layer structure of the photovoltaic element to be produced. Further, in each semiconductor formation vacuum vessel, a film formation region adjustment plate, not shown in the drawings, for adjusting the contact surface area between the conductive substrate 204 and the discharge space is installed.

At first, prior to the photovoltaic element production, a confirmation experiment of a film forming rate of a silicon-based thin film was carried out. A belt-like substrate (50 cm width; 200 m length; 0.125 mm thickness) made of a stainless steel (SUS430BA) was sufficiently degreased and washed and installed in a continuous sputtering apparatus, not shown in the drawings, and a 100 nm-thick Al thin film was deposited by sputtering evaporation using an Al electrode target. Further, using a ZnO target, a 1.2 µm-thick ZnO thin film was deposited by sputtering evaporation on the Al thin film to form a belt-like conductive substrate 204.

Next, a bobbin on which the conductive substrate 204 was wound was installed in a substrate wind-off vessel 202. The conductive substrate 204 was passed to the substrate wind-up vessel 203 through a gas gate on the transporting-in side, the semiconductor formation vacuum vessels 211, 212, 213, 214, 215, 216, and a gas gate on the transporting-out side and the tensile force adjustment was performed so as to prevent the belt-like conductive substrate 204 from sagging. Then, the substrate wind off vessel 202, the semiconductor formation vacuum vessels 211, 212, 213, 214, 215, 216, and the substrate wind-up vessel 203 were sufficiently vacuum evacuated to $6.7 \times 10^{-4}$ Pa ($5 \times 10^{-6}$ Torr) or less by a vacuum exhaust system comprising a vacuum pump, not shown in the drawings.

Next, while the vacuum exhaust system being operated, source gases and a diluting gas were supplied to the semiconductor formation vacuum vessel 212 through the gas introduction pipe 232. Here, the semiconductor formation vacuum vessel 212 employed here had the deposition chamber with a length of 1 m in the longitudinal direction and a transverse width of 50 cm. Further, $H_2$ gas was supplied at 200 $cm^3$/min (normal) to semiconductor formation vacuum vessels other than the semiconductor formation vacuum vessel 212 through a gas introduction pipe and simultaneously $H_2$ gas was supplied at 500 $cm^3$/min (normal) as a gate gas to respective gas gates through respective gate gas supply pipes, not shown in the drawings. Under such a state, the exhaust power of the vacuum exhaust system was adjusted to adjust the pressure of the semiconductor formation vacuum vessel 212 at a predetermined pressure. The formation conditions are shown in the 212 column of Table 1.

When the internal pressure of the semiconductor formation vacuum vessel 212 was stabilized, transportation of the conductive substrate 204 was started to the substrate wind-up vessel 203 from the substrate wind-off vessel 202.

Next, high frequency was introduced into the high frequency introduction part 242 of the semiconductor formation vacuum vessel 212 from a high frequency power source 252, and while the distance between the foregoing conductive substrate and the high frequency introduction part was changed as the predetermined distance shown in Table 2 by the height adjustment mechanism, glow discharge was generated in the deposition chamber of the semiconductor formation vacuum vessel 212 and a silicon-based thin film was deposited on the conductive substrate 204. In this case, high frequency with a frequency of 60 MHz was introduced into the semiconductor formation vacuum vessel 212 through the high frequency introduction part 242 composed of a metal electrode made of Al, while the power density is adjusted to be 400 mW/$cm^3$. Each film thickness of the respectively formed i-type semiconductor layers was measured by cross sectional TEM observation to obtain the film forming rate. The obtained film forming rate values are shown in Table 2. In this case, the i-type semiconductor layer when the distance between the conductive substrate and the high frequency introduction part was 2 mm had inferior evenness of the film thickness and therefore the average film forming rate could not be obtained. Further, in the respective conditions, the luminous intensity of the plasma in the periphery of the substrate was measured by PDA (photo diode array) spectrometer to find the luminous intensity attributed to SiF$\alpha$ (440 nm) in the luminous intensity of generated plasma was equal to or higher than the luminous intensity attributed to H$\alpha$ (656 nm).

Further, in relation to the respective distances between the conductive substrate and the high frequency introduction part, silicon-based thin films evenly having a film thickness of 1 µm were formed and the diffraction peaks were determined by an X-ray diffraction apparatus to investigate the ratio of the diffraction intensity of (220) plane to the whole diffraction intensity and calculate the Scherrer radius from the half-width of the diffraction peak of the reflection by the (220) plane. Further, Raman scattering intensity was measured to calculate the ratio of the Raman scattering intensity at 520 cm$^{-1}$ vicinity (attributed to the crystal component) to the Raman scattering intensity at 480 cm$^{-1}$ vicinity (attributed to the amorphous component). Their results are shown in Table 2.

As shown in Table 2, by controlling the distance between the conductive substrate and the high frequency introduction part to 3 mm or more but 30 mm or less, it was made possible to form a silicon-based thin film excellent in (220) orientation property and crystallinity and having a large crystal size at a high film forming rate.

Next, a photovoltaic element was produced. While the vacuum exhaust system being operated, source gases and a diluting gas were supplied to the semiconductor formation vacuum vessels 211, 212 and 213 through the gas introduction pipes 231, 232 and 233. The semiconductor formation vacuum vessel 212 employed here had the deposition chamber with a length of 1 m in the longitudinal direction and a transverse width of 50 cm. Further, H$_2$ gas was supplied at 200 cm$^3$/min (normal) to semiconductor formation vacuum vessels other than the semiconductor formation vacuum vessels 211, 212 and 213 through a gas introduction pipe and simultaneously H$_2$ gas was supplied at 500 sccm as a gate gas to respective gas gates through respective gate gas supply pipes, not illustrated. Under such a state, the exhaust power of the vacuum exhaust system was adjusted to control the pressure of the semiconductor formation vacuum vessels 211, 212 and 213 to a predetermined pressure. The formation conditions are shown in Table 1.

When the internal pressure of the semiconductor formation vacuum vessels 211, 212 and 213 was stabilized, transportation of the conductive substrate 204 was started to the substrate wind-up vessel 203 from the substrate wind-off vessel 202.

Next, high frequency was introduced into the high frequency introduction parts 241 to 243 of the semiconductor formation vacuum vessels 211 to 213 from a high frequency power source 251 to 253, glow discharge was generated in the deposition chambers of the semiconductor formation vacuum vessels 211 to 213, and an amorphous n-type semiconductor layer (film thickness of 30 nm), a microcrystalline i-type semiconductor layer (film thickness of 1.5 µm), and a microcrystalline p-type semiconductor layer (film thickness of 10 nm) were formed on the conductive substrate 204 to produce a photovoltaic element. In this case, high frequency electric power with a frequency of 13.56 MHz and a power density of 5 mW/cm$^3$ was introduced into the semiconductor formation vacuum vessel 211, through the high frequency introduction part 241 composed of a metal electrode made of Al; while the distance of the above-described conductive substrate and the high frequency introduction part being changed to be predetermined distances (except for 2 mm) shown in Table 2 by the height adjustment mechanism in the same manner as the case of the above-described silicon-based thin film formation, high frequency electric power with a frequency of 60 MHz was introduced into the semiconductor formation vacuum vessel 212, through the high frequency introduction part 242 composed of a metal electrode made of Al while the power density being adjusted to be 400 mW/cm$^3$; and high frequency electric power with a frequency of 13.56 MHz and a power density of 30 mW/cm$^3$ was introduced into the semiconductor formation vacuum vessel 213, through the high frequency introduction part 243 composed of a metal electrode made of Al. In this case, the film thickness was controlled to be an uniform thickness by using the film formation region adjustment plate corresponding to the film forming rates calculated for respective photovoltaic elements. Next, using a continuously module-manufacturing apparatus, not shown in the drawings, the produced belt-like photovoltaic elements were processed to produce a solar cell module with a size of 36 cm×22 cm.

The photoelectric conversion efficiency of each solar cell module was measured by employing a solar simulator (AM 1.5, 100 mW/cm$^2$). The results are shown in Table 2.

The photovoltaic elements produced in the condition that the distance of the conductive substrate and the high frequency introduction part was 3 mm or more but 30 mm or less consequently showed a high photoelectric conversion efficiency. Accordingly, it is found that the solar cell modules comprising the photovoltaic elements of the present invention have excellent characteristics.

EXAMPLE 2

Using a deposited film forming apparatus 201 illustrated in FIG. 2, a photovoltaic element illustrated in FIG. 4 was produced by the following procedure. FIG. 4 is a schematic sectional view showing one example of a photovoltaic element comprising a silicon-based thin film of the present invention. In the figure, the same reference characters denote the same members as in FIG. 1, and their descriptions are omitted. The semiconductor layer of the photovoltaic element is composed of an amorphous n-type semiconductor layer 102-1A, a microcrystalline i-type semiconductor layer 102-2A, and a microcrystalline p-type semiconductor layer 102-3A. That is, the photovoltaic element is so-called a pin-type single cell photovoltaic element.

In the same manner as in Example 1, a belt-like conductive substrate 204 was produced and installed in a deposited film forming apparatus 201, and then the substrate wind-off vessel 202, the semiconductor formation vacuum vessels 211, 212, 213, 214, 215, 216, and the substrate wind-up vessel 203 were sufficiently vacuum-evacuated to 6.7×10$^{-4}$ Pa (5×10$^{-6}$ Torr) or less by a vacuum exhaust system comprising a vacuum pump, not shown in the drawings.

Next, while the vacuum exhaust system being operated, source gases and a diluting gas were supplied to the semiconductor formation vacuum vessels 211, 212 and 213 through the gas introduction pipes 231, 232 and 233. The semiconductor formation vacuum vessel 212 employed here had the deposition chamber with a length of 1 m in the longitudinal direction and a transverse width of 50 cm.

Further, H$_2$ gas was supplied at 200 cm$^3$/min (normal) to semiconductor formation vacuum vessels other than the semiconductor formation vacuum vessels 211, 212 and 213 through a gas introduction pipe and simultaneously H$_2$ gas was supplied at 500 sccm as a gate gas to respective gas gates through respective gate gas supply pipes, not shown in the drawings. Under such a state, the exhaust power of the vacuum exhaust system was adjusted to control the pressure of the semiconductor formation vacuum vessels 211, 212 and 213 to a predetermined pressure. The formation conditions are shown in Table 3.

When the internal pressure of the semiconductor formation vacuum vessels 211, 212 and 213 was stabilized, transportation of the conductive substrate 204 was started to the substrate wind-up vessel 203 from the substrate wind-off vessel 202.

Next, high frequency was introduced into the high frequency introduction parts 241 to 243 of the semiconductor formation vacuum vessels 211 to 213 from a high frequency power source 251 to 253; glow discharge was generated in the deposition chambers of the semiconductor formation vacuum vessels 211 to 213; and an amorphous n-type semiconductor layer (film thickness of 30 nm), a microcrystalline i-type semiconductor layer (film thickness of 1.5 μm), and a microcrystalline p-type semiconductor layer (film thickness of 10 nm) were formed on the conductive substrate 204 to produce a photovoltaic element. In this case, high frequency electric power with a frequency of 13.56 MHz and a power density of 5 mW/cm$^3$ was introduced into the semiconductor formation vacuum vessel 211, through the high frequency introduction part 241 composed of a metal electrode made of Al; after the distance of the above-described conductive substrate and the high frequency introduction part was set to be 5 mm, high frequency electric power with a frequency of 100 MHz was introduced into the semiconductor formation vacuum vessel 212, through the high frequency introduction part 242 composed of a metal electrode made of Al while the power density being adjusted to be 500 mW/cm$^3$; and high frequency electric power with a frequency of 13.56 MHz and a power density of 30 mW/cm$^3$ was introduced into the semiconductor formation vacuum vessel 213, through the high frequency introduction part 243 composed of a metal electrode made of Al. Next, using a continuously module-manufacturing apparatus not shown in the drawings, the produced belt-like photovoltaic elements were processed to produce a solar cell module with a size of 36 cm×22 cm. The above-described process was carried out while changing the pressure of the inside of the semiconductor formation vacuum vessel 212 to the pressure values shown in Table 4. At that time, the source gases to be introduced into the semiconductor formation vacuum vessel 212 were passed while the flow rates of the gases being so adjusted as to satisfy τ=0.5 seconds and also the ratio of SiF$_4$ and H$_2$ was 1:4. In the respective conditions, the luminous intensity of the plasma in the periphery of the substrate was measured by PDA (photo diode array) spectrometer to find that the luminous intensity attributed to SiFα (440 nm) in the luminous intensity of generated plasma was equal to or higher than the luminous intensity attributed to Hα (656 nm).

The photoelectric conversion efficiency of each solar cell module produced in the above-described manner was measured by employing a solar simulator (AM 1.5, 100 mW/cm$^3$). Also, the adhesion of the conductive substrate and the semiconductor layer was investigated using a cross cut tape test (intervals of the scratches: 1 mm; number of the squares in cross cut tape: 100). The alteration of the photoelectric conversion efficiency by a temperature-humidity test was investigated by installing a solar cell module, whose initial photoelectric conversion efficiency was previously measured, in a dark place at a temperature of 85° C. and a humidity of 85% for 30 minutes, cooling the solar cell module to −20° C. over 70 minutes and holding at −20° C. for 30 minutes, and again heating the solar cell module back to a temperature of 85° C. and a humidity of 85% over 70 minutes, and measuring the photoelectric conversion efficiency again after the cycle of these steps was repeated 100 times. The results are shown in Table 4.

It is found from Table 4 that the solar cell modules comprising photovoltaic elements produced in the pressure of the inside of the semiconductor formation vacuum vessel 218 in a range from 90 Pa or higher but 15,000 Pa or lower are excellent in respective items: the photoelectric conversion efficiency, the peeling test, and the temperature-humidity test and especially, the solar cell modules comprising photovoltaic elements produced in the pressure in a range from 100 Pa or higher to 5,000 Pa or lower were found excellent particularly in the peeling test. Accordingly, it is found that the solar cell modules comprising the photovoltaic elements of the present invention have excellent characteristics.

EXAMPLE 3

Using a deposited film forming apparatus 201 illustrated in FIG. 2, a photovoltaic element illustrated in FIG. 4 was produced by the following procedure. FIG. 4 is a schematic sectional view showing one example of a photovoltaic element comprising a silicon-based thin film of the present invention. In the figure, the same reference characters denote the same members as in FIG. 1, and their descriptions are omitted. The semiconductor layer of the photovoltaic element was composed of an amorphous n-type semiconductor layer 102-1A, a microcrystalline i-type semiconductor layer 102-2A, and a microcrystalline p-type semiconductor layer 102-3A. That is, the photovoltaic element was so-called a pin-type single cell photovoltaic element.

In the same manner as in Example 1, a belt-like conductive substrate 204 was formed and installed in a deposited film forming apparatus 201, and then the substrate wind-off vessel 202, the semiconductor formation vacuum vessels 211, 212, 213, 214, 215, 216, and the substrate wind-up vessel 203 were sufficiently vacuum-evacuated to 6.7×10$^{-4}$ Pa (5×10$^{-6}$ Torr) or less by a vacuum exhaust system comprising a vacuum pump, not shown in the drawings.

Next, while the vacuum exhaust system being operated, source gases and a diluting gas were supplied to the semiconductor formation vacuum vessels 211, 212 and 213 through the gas introduction pipes 231, 232 and 233. The semiconductor formation vacuum vessel 212 employed here had the deposition chamber with a length of 1 m in the longitudinal direction and a transverse width of 50 cm. Further, H$_2$ gas was supplied at 200 cm$^3$/min (normal) to semiconductor formation vacuum vessels other than the semiconductor formation vacuum vessels 211, 212 and 213 through a gas introduction pipe and simultaneously H$_2$ gas was supplied at 500 sccm as a gate gas to respective gas gates through respective gate gas supply pipes, not shown in the drawings. Under such a state, the exhaust power of the vacuum exhaust system was adjusted to control the pressure of the semiconductor formation vacuum vessels 211, 212 and 213 at a predetermined pressure. The formation conditions are shown in Table 5.

When the internal pressure of the semiconductor formation vacuum vessels 211, 212 and 213 was stabilized, transportation of the conductive substrate 204 was started to the substrate wind-up vessel 203 from the substrate wind-off vessel 202.

Next, high frequency was introduced into the high frequency introduction parts 241 to 243 of the semiconductor formation vacuum vessels 211 to 213 from a high frequency power source 251 to 253; glow discharge was generated in the deposition chambers of the semiconductor formation vacuum vessels 211 to 213; and an amorphous n-type semiconductor layer (film thickness of 30 nm), a microcrystalline i-type semiconductor layer (film thickness of 1.5 µm), and a microcrystalline p-type semiconductor layer (film thickness of 10 nm) were formed on the conductive substrate 204 to produce a photovoltaic element. In this case, high frequency electric power with a frequency of 13.56 MHz and a power density of 5 mW/cm$^3$ was introduced into the semiconductor formation vacuum vessel 211, through the high frequency introduction part 241 composed of a metal electrode made of Al; after the distance of the above-described conductive substrate and the high frequency introduction part was set to be 5 mm, high frequency electric power with a frequency of 60 MHz was introduced into the semiconductor formation vacuum vessel 212, through the high frequency introduction part 242 composed of a metal electrode made of Al while the power density being adjusted so as to be 500 mW/cm$^3$; and high frequency electric power with a frequency of 13.56 MHz and a power density of 30 mW/cm$^3$ was introduced into the semiconductor formation vacuum vessel 213, through the high frequency introduction part 243 composed of a metal electrode made of Al. Next, using a continuously module-manufacturing apparatus, not shown in the drawings, the produced belt-like photovoltaic elements were processed to produce solar cell modules with a size of 36 cm×22 cm. The above-described process was carried out while changing the residence time in the semiconductor formation vacuum vessel 212 at every residence time shown in Table 6. At that time, the source gases to be introduced into the semiconductor formation vacuum vessel 212 were adjusted so as to satisfy each residence time and so that the ratio of $SiF_4$ and $H_2$ was 1:3. In the respective conditions, the luminous intensity of the plasma in the periphery of the substrate was measured by PDA (photo diode array) spectrometer to find that the luminous intensity attributed to SiFα (440 nm) of the luminous intensity of generated plasma was equal to or higher than the luminous intensity attributed to Hα (656 nm).

The photoelectric conversion efficiency of each solar cell module produced in the above-described manner was measured by employing a solar simulator (AM 1.5, 100 mW/cm$^3$). Also, the adhesion of the conductive substrate and the semiconductor layer was investigated using a cross cut tape test (intervals of the scratches: 1 mm; number of the squares in cross cut tape: 100). The alteration of the photoelectric conversion efficiency by a temperature-humidity test was investigated by installing a solar cell module, whose initial photoelectric conversion efficiency was previously measured, in a dark place at a temperature of 85° C. and a humidity of 85% for 30 minutes, cooling the solar cell module to −20° C. over 70 minutes and holding at −20° C. for 30 minutes, and again heating the solar cell module back to a temperature of 85° C. and a humidity of 85% over 70 minutes, and measuring the photoelectric conversion efficiency again after the cycle of these steps was repeated 100 times. The results are shown in Table 6.

It is found from Table 6 that the solar cell modules comprising photovoltaic elements produced while the residence time in the semiconductor formation vacuum vessel 212 being adjusted in a range from 0.1 seconds or longer but 10 seconds or shorter are excellent in respective items: the photoelectric conversion efficiency, the peeling test, and the temperature-humidity test and especially, the solar cell modules comprising photovoltaic elements produced while the residence time being adjusted in a range from 0.2 seconds or longer but 3.0 seconds or shorter were found excellent particularly in the peeling test. Accordingly, it is found that the solar cell modules comprising the photovoltaic elements of the present invention have excellent characteristics.

EXAMPLE 4

Using a deposited film forming apparatus 201 illustrated in FIG. 2, a photovoltaic element illustrated in FIG. 4 was produced by the following procedure. FIG. 4 is a schematic sectional view showing one example of a photovoltaic element comprising a silicon-based thin film of the present invention. In the figure, the same reference characters denote the same members as in FIG. 1, and their descriptions are omitted. The semiconductor layer of the photovoltaic element was composed of an amorphous n-type semiconductor layer 102-1A, a microcrystalline i-type semiconductor layer 102-2A, and a microcrystalline p-type semiconductor layer 102-3A. That is, the photovoltaic element was so-called a pin-type single cell photovoltaic element.

In the same manner as in Example 1, a belt-like conductive substrate 204 was produced and installed in a deposited film forming apparatus 201 and then the substrate wind-off vessel 202, the semiconductor formation vacuum vessels 211, 212, 213, 214, 215, 216, and the substrate wind-up vessel 203 were sufficiently vacuum evacuated to 6.7×10$^{-4}$ Pa (5×10$^{-6}$ Torr) or less by a vacuum exhaust system comprising a vacuum pump, not shown in the drawings.

Next, while the vacuum exhaust system being operated, source gases and a diluting gas were supplied to the semiconductor formation vacuum vessels 211, 212 and 213 through the gas introduction pipes 231, 232 and 233. The semiconductor formation vacuum vessel 212 employed here had the deposition chamber with a length of 1 m in the longitudinal direction and a transverse width of 50 cm. Further, $H_2$ gas was supplied at 200 cm$^3$/min (normal) to semiconductor formation vacuum vessels other than the semiconductor formation vacuum vessels 211, 212, 213 through a gas introduction pipe and simultaneously $H_2$ gas was supplied at 500 sccm as a gate gas to respective gas gates through respective gate gas supply pipes, not shown in the drawings. Under such a state, the exhaust power of the vacuum exhaust system was adjusted to control the pressure of the semiconductor formation vacuum vessels 211, 212 and 213 at a predetermined pressure. The formation conditions are shown in Table 7.

When the internal pressure of the semiconductor formation vacuum vessels 211, 212 and 213 was stabilized, transportation of the conductive substrate 204 was started to the substrate wind-up vessel 203 from the substrate wind-off vessel 202.

Next, high frequency was introduced into the high frequency introduction parts 241 to 243 of the semiconductor formation vacuum vessels 211 to 213 from a high frequency power source 251 to 253; glow discharge was generated in the deposition chambers of the semiconductor formation vacuum vessels 211 to 213; and an amorphous n-type semiconductor layer (film thickness of 30 nm), a microcrystalline i-type semiconductor layer (film thickness of 1.5 μm), and a microcrystalline p-type semiconductor layer (film thickness of 10 nm) were formed on the conductive substrate 204 to produce a photovoltaic element. In this case, high frequency electric power with a frequency of 13.56 MHz and a power density of 5 mW/cm$^3$ was introduced into the semiconductor formation vacuum vessel 211, through the high frequency introduction part 241 composed of a metal electrode made of Al; after the distance of the above-described conductive substrate and the high frequency introduction part was set to be 9 mm, high frequency electric power with a frequency of 60 MHz was introduced into the semiconductor formation vacuum vessel 212, through the high frequency introduction part 242 composed of a metal electrode made of Al while the power density being adjusted so as to be 500 mW/cm$^3$; and high frequency electric power with a frequency of 13.56 MHz and a power density of 30 mW/cm$^3$ was introduced into the semiconductor formation vacuum vessel 213, through the high frequency introduction part 243 composed of a metal electrode made of Al. Next, using a continuously module-manufacturing apparatus, not shown in the drawings, the produced belt-like photovoltaic elements were processed to produce solar cell modules with a size of 36 cm×22 cm. The above-described process was carried out while adding SiH$_4$ in predetermined amounts as shown in Table 8 to the source gases in the semiconductor formation vacuum vessel 212. In the respective conditions, the luminous intensity of the plasma in the periphery of the substrate was measured by PDA (photo diode array) spectrometer and the results are shown in Table 8.

The photoelectric conversion efficiency of each solar cell module produced in the above-described manner was measured by employing a solar simulator (AM 1.5, 100 mW/cm$^2$). The results are shown in Table 8.

It is found from Table 8 that the solar cell modules comprising photovoltaic elements produced under the condition that the luminous intensity attributed to SiFα (440 nm) of the luminous intensity of generated plasma is equal to or higher than the luminous intensity attributed to Hα (656 nm) have a high photoelectric conversion efficiency. Accordingly, the solar cell modules comprising the photovoltaic elements of the present invention were found having excellent characteristics.

EXAMPLE 5

Using a deposited film forming apparatus 201 illustrated in FIG. 2, a photovoltaic element illustrated in FIG. 4 was produced by the following procedure. FIG. 4 is a schematic sectional view showing one example of a photovoltaic element comprising a silicon-based thin film of the present invention. In the figure, the same reference characters denote the same members as in FIG. 1, and their descriptions are omitted. The semiconductor layer of the photovoltaic element was composed of an amorphous n-type semiconductor layer 102-1A, a microcrystalline i-type semiconductor layer 102-2A, and a microcrystalline p-type semiconductor layer 102-3A. That is, the photovoltaic element was so-called a pin-type single cell photovoltaic element.

In the same manner as in Example 1, a belt-like conductive substrate 204 was produced and installed in a deposited film forming apparatus 201 and then the substrate wind-off vessel 202, the semiconductor formation vacuum vessels 211, 212, 213, 214, 215, 216, and the substrate wind-up vessel 203 were sufficiently vacuum-evacuated to 6.7×10$^{-4}$ Pa (5×10$^{-6}$ Torr) by a vacuum exhaust system comprising a vacuum pump, not shown in the drawings.

Next, while the vacuum exhaust system being operated, source gases and a diluting gas were supplied to the semiconductor formation vacuum vessels 211, 212 and 213 through the gas introduction pipes 231, 232 and 233. The semiconductor formation vacuum vessel 212 employed here had the deposition chamber with a length of 1 m in the longitudinal direction and a transverse width of 50 cm. Further, H$_2$ gas was supplied at 200 cm$^3$/min (normal) to semiconductor formation vacuum vessels other than the semiconductor formation vacuum vessels 211, 212 and 213 through a gas introduction pipe and simultaneously H$_2$ gas was supplied at 500 sccm as a gate gas to respective gas gates through respective gate gas supply pipes, not shown in the drawings. Under such a state, the exhaust power of the vacuum exhaust system was adjusted to control the pressure of the semiconductor formation vacuum vessels 211, 212 and 213 at a predetermined pressure. The formation conditions are shown in Table 9.

When the internal pressure of the semiconductor formation vacuum vessels 211, 212 and 213 was stabilized, transportation of the conductive substrate 204 was started to the substrate wind-up vessel 203 from the substrate wind-off vessel 202.

Next, high frequency was introduced into the high frequency introduction parts 241 to 243 of the semiconductor formation vacuum vessels 211 to 213 from a high frequency power source 251 to 253; glow discharge was generated in the deposition chambers of the semiconductor formation vacuum vessels 211 to 213; and an amorphous n-type semiconductor layer (film thickness of 30 nm), a microcrystalline i-type semiconductor layer (film thickness of 1.5 μm), and a microcrystalline p-type semiconductor layer (film thickness of 10 nm) were formed on the conductive substrate 204 to produce a photovoltaic element. In this case, high frequency electric power with a frequency of 13.56 MHz and a power density of 5 mW/cm$^3$ was introduced into the semiconductor formation vacuum vessel 211, through the high frequency introduction part 241 composed of a metal electrode made of Al, and high frequency electric power with a frequency of 13.56 MHz and a power density of 30 mW/cm$^3$ was introduced into the semiconductor formation vacuum vessel 213, through the high frequency introduction part 243 composed of a metal electrode made of Al. In this case, after the distance of the above-described conductive substrate and the high frequency introduction part was set to be 9 mm, high frequency electric power with a frequency of 100 MHz was introduced into the semiconductor formation vacuum vessel 212, through the high frequency introduction part 242 composed of a metal electrode made of Al while the power density being changed as shown in Table 10. Next, using a continuously module-manufacturing apparatus, not shown in the drawings, the produced belt-like photovoltaic elements were processed to produce solar cell modules with a size of 36 cm×22 cm. At the respective power densities, the luminous intensity of the plasma in the periphery of the substrate in the semiconductor formation vacuum vessel 212 was measured by PDA (photo diode array) spectrometer, and the results are shown in Table 10.

The photoelectric conversion efficiency of each solar cell module produced in the above-described manner was measured by employing a solar simulator (AM 1.5, 100 mW/cm$^3$). The results are shown in Table 10.

It is found from Table 10 that the solar cell modules comprising photovoltaic elements produced under the condition that the luminous intensity of the plasma in the periphery of the substrate satisfied that the luminous intensity attributed to SiFα (440 nm) of the luminous intensity of generated plasma is equal to or higher than the luminous intensity attributed to Hα (656 nm) have a high photoelectric conversion efficiency. Accordingly, it is found that the solar cell modules comprising the photovoltaic elements of the present invention are excellent characteristics.

EXAMPLE 6

Figure 5:
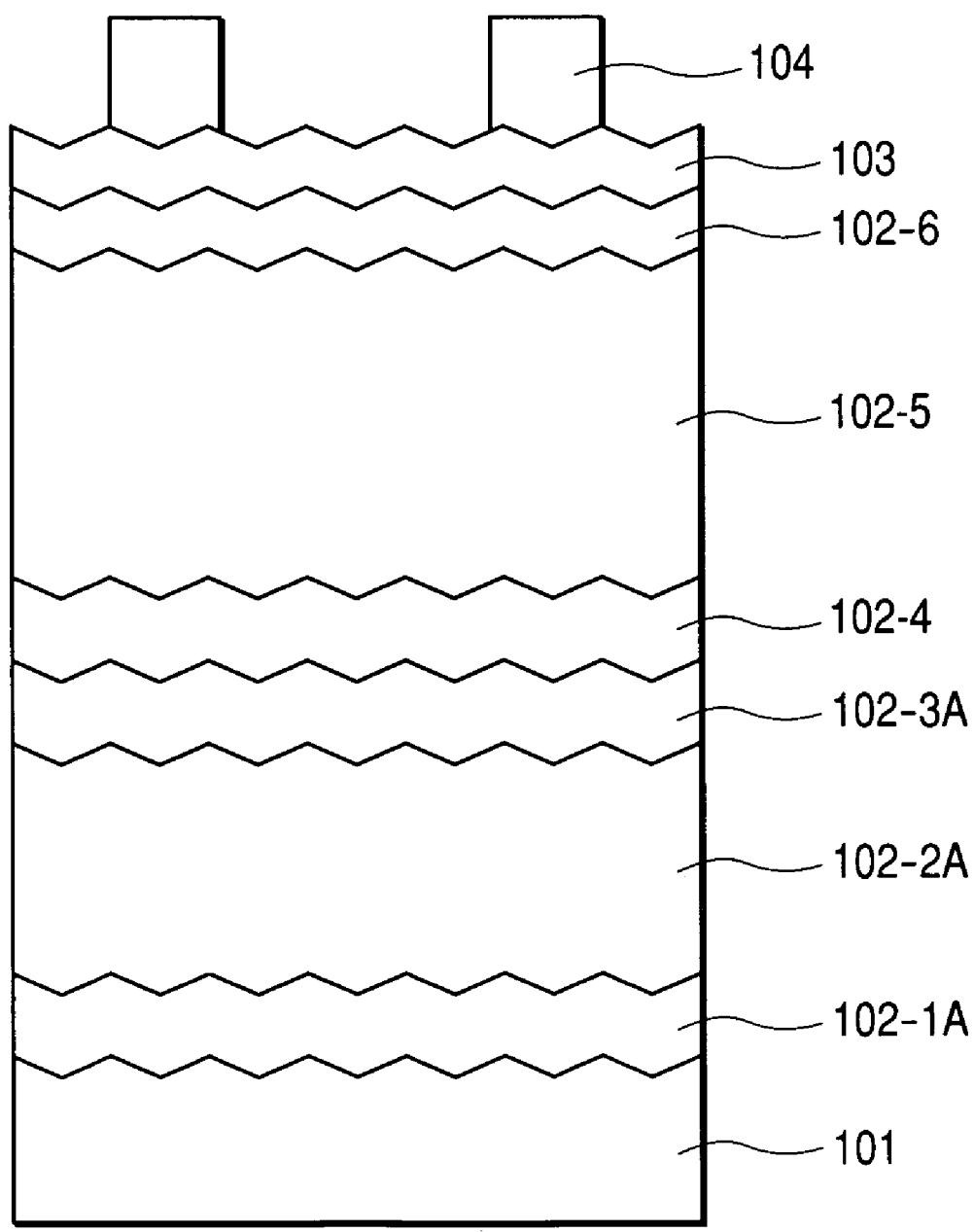
FIG. 5 is a schematic sectional view showing one example of a photovoltaic element containing a silicon-based thin film of the present invention.

Using a deposited film forming apparatus 201 illustrated in FIG. 2, a photovoltaic element illustrated in FIG. 5 was produced by the following procedure. FIG. 5 is a schematic sectional view showing one example of a photovoltaic element comprising silicon-based thin films of the present invention. In the figure, the same reference characters denote the same members as in FIG. 1, and their descriptions are omitted. The semiconductor layers of the photovoltaic element were composed of amorphous n-type semiconductor layers 102-1A and 102-4, a microcrystalline i-type semiconductor layer 102-2A, an amorphous i-type semiconductor layers 102-5, and microcrystalline p-type semiconductor layers 102-3A and 102-6. That is, the photovoltaic element was so-called a pinpin-type double cell photovoltaic element.

In the same manner as in Example 1, a belt-like conductive substrate 204 was produced and installed in a deposited film forming apparatus 201 and then the substrate wind-off vessel 202, the semiconductor formation vacuum vessels 211, 212, 213, 214, 215, 216, and the substrate wind-up vessel 203 were sufficiently vacuum evacuated to $6.7 \times 10^{-4}$ Pa ($5 \times 10^{-6}$ Torr) or less by a vacuum exhaust system comprising a vacuum pump, not illustrated.

Next, while the vacuum exhaust system being operated, source gases and a diluting gas were supplied to the semiconductor formation vacuum vessels 211 to 216 through the gas introduction pipes 231 to 236. The semiconductor formation vacuum vessel 212 employed here had the deposition chamber with a length of 1 m in the longitudinal direction and a transverse width of 50 cm. Further, $H_2$ gas was supplied at 500 sccm as a gate gas to respective gas gates through respective gate gas supply pipes, not illustrated. Under such a state, the exhaust power of the vacuum exhaust system was adjusted to control the pressure of the semiconductor formation vacuum vessels 211 to 216 at a predetermined pressure. The formation conditions are shown in Table 11.

When the internal pressure of the semiconductor formation vacuum vessels 211 to 216 was stabilized, transportation of the conductive substrate 204 was started to the substrate wind-up vessel 203 from the substrate wind-off vessel 202.

Next, high frequency was introduced into the high frequency introduction parts 241 to 246 of the semiconductor formation vacuum vessels 211 to 216 from a high frequency power source 251 to 256; glow discharge was generated in the deposition chambers of the semiconductor formation vacuum vessels 211 to 216; and an amorphous n-type semiconductor layer (film thickness of 30 nm), a microcrystalline i-type semiconductor layer (film thickness of 2.0 µm), a microcrystalline p-type semiconductor layer (film thickness of 10 nm), an amorphous n-type semiconductor layer (film thickness of 30 nm), an amorphous i-type semiconductor layer (film thickness of 300 nm), and a microcrystalline p-type semiconductor layer (film thickness of 10 nm) were formed on the conductive substrate 204 to produce a photovoltaic element. In this case, high frequency electric power with a frequency of 13.56 MHz and a power density of 5 mW/cm$^3$ was introduced into the semiconductor formation vacuum vessels 211 and 214, through the high frequency introduction parts 241 and 244 composed of metal electrodes made of Al; after the distance of the above-described conductive substrate and the high frequency introduction part was set to be 5 mm, high frequency electric power with a frequency of 60 MHz was introduced into the semiconductor formation vacuum vessel 212, through the high frequency introduction part 242 composed of a metal electrode made of Al while the power density being adjusted so as to be 500 mW/cm$^3$; high frequency electric power with a frequency of 100 MHz was introduced into the semiconductor formation vacuum vessel 215, through the high frequency introduction part 245 composed of a metal electrode made of Al while the power density being adjusted so as to be 100 mW/cm$^3$; and high frequency electric power with a frequency of 13.56 MHz and a power density of 30 mW/cm$^3$ was introduced into the semiconductor formation vacuum vessel 213 and 216, through the high frequency introduction parts 243 and 246 composed of metal electrodes made of Al. Next, using a continuously module-manufacturing apparatus, not shown in the drawings, the produced belt-like photovoltaic elements were processed to produce solar cell modules with a size of 36 cm×22 cm.

The photoelectric conversion efficiency of each solar cell module produced in the above-described manner was measured by employing a solar simulator (AM 1.5, 100 mW/cm$^3$), and the photoelectric conversion efficiency was 1.2 times as high as that of a single type solar cell module produced with a residence time of 1.0 second in Example 3. Also, excellent results were achieved in the peeling test and the temperature-humidity test. Accordingly, it is found that the solar cell modules comprising the photovoltaic elements of the present invention have excellent characteristics.

A silicon-based thin film with a scarce defect density, a high crystallinity, and an excellent orientation property can be formed at a further increased rate, and use of the foregoing silicon-based thin film for at least a part of at least one i-type semiconductor layer in a photovoltaic element comprising semiconductor layers having at least one pair pin junction on a substrate makes it possible to produce the photovoltaic element having a high photoelectric conversion efficiency, good adhesion, and excellent resistance to the environments at a low cost.

TABLE 1

| | |
|---|---|
| Formation condition of 211 | |
| Source gases | SiH$_4$: 20 cm$^3$/min (normal) |
| | H$_2$: 100 cm$^3$/min (normal) |
| | PH$_3$ (diluted to 2% with H$_2$): 30 cm$^3$/min (normal) |
| Substrate temperature | 300° C. |
| Pressure | 133 Pa (1.0 Torr) |
| Formation condition of 212 | |
| Source gases | SiF$_4$:H$_2$ = 1:3 |
| | τ = 0.4 seconds |
| Substrate temperature | 350° C. |

TABLE 1-continued

| | |
|---|---|
| Pressure Formation condition of 213 | 200 Pa (1.5 Torr) |
| Source gases | SiH$_4$: 10 cm$^3$/min (normal)<br>H$_2$: 800 cm$^3$/min (normal)<br>BF$_3$ (diluted to 2% with H$_2$): 100 cm$^3$/min (normal) |
| Substrate temperature | 200° C. |
| Pressure | 160 Pa (1.2 Torr) |

TABLE 2

| | | | | | | | |
|---|---|---|---|---|---|---|---|
| Distance between conductive substrate and high frequency introduction part (mm) | 2 | 3 | 6 | 9 | 15 | 30 | 50 |
| Film forming rate (nm/s) | — | 1 | 0.98 | 0.97 | 0.97 | 0.95 | 0.75 |
| Ratio of diffraction intensity of (220) to entire diffraction intensity | — | 1 | 1.01 | 1.03 | 0.99 | 1.02 | 0.90 |
| Scherrer of (220) | — | 1 | 1.05 | 1.10 | 1.02 | 1.05 | 0.85 |
| Raman intensity ratio (520 cm$^{-1}$/480 cm$^{-1}$) | — | 1 | 1.05 | 1.05 | 1.00 | 0.95 | 0.85 |
| Photoelectric conversion efficiency | — | 1 | 1.1 | 1.2 | 1.2 | 1.1 | 0.7 |

The respective values are relative values calculated by standardizing the values obtained in the case the distance of the conductive substrate and the high frequency introduction part is 3 mm to be 1.

TABLE 4

| | | | | | | | | |
|---|---|---|---|---|---|---|---|---|
| Internal pressure of semiconductor formation vacuum vessel 218 (Pa) | 50 | 90 | 100 | 1 × 10$^3$ | 5 × 10$^3$ | 1 × 10$^4$ | 1.5 × 10$^4$ | 2 × 10$^4$ |
| Photoelectric conversion efficiency | 1 | 1.3 | 1.5 | 1.5 | 1.5 | 1.4 | 1.4 | 0.9 |
| Peeling test | C | A | AA | AA | AA | A | A | B |
| Temperature-humidity test | 0.75 | 0.9 | 1.0 | 1.0 | 1.0 | 0.9 | 0.9 | 0.7 |

The values of photoelectric conversion efficiency are relative values calculated by standardizing the values obtained in the case the internal pressure of the semiconductor formation vacuum vessel 212 is 50 Pa to be 1. The symbols of the peeling test respectively means as follows: AA: 0, A: 1 to 2; B: 3 to 10; C: 10 to 100 of the number of peeled squares. The value of the temperature-humidity test shows (photoelectric conversion efficiency after the test)/(photoelectric conversion efficiency before the test).

TABLE 3

| | |
|---|---|
| Formation condition of 211 | |
| Source gases | SiH$_4$: 20 cm$^3$/min (normal)<br>H$_2$: 100 cm$^3$/min (normal)<br>PH$_3$ (diluted to 2% with H$_2$): 30 cm$^3$/min (normal) |
| Substrate temperature | 300° C. |
| Pressure | 133 Pa (1.0 Torr) |
| Formation condition of 212 | |
| Source gases | SiF$_4$:H$_2$ = 1:4<br>τ = 0.5 seconds |
| Substrate temperature | 350° C. |
| Pressure | See Table 4 |
| Formation condition of 213 | |
| Source gases | SiH$_4$: 10 cm$^3$/min (normal)<br>H$_2$: 800 cm$^3$/min (normal)<br>BF$_3$ (diluted to 2% with H$_2$): 100 cm$^3$/min (normal) |
| Substrate temperature | 200° C. |
| Pressure | 160 Pa (1.2 Torr) |

TABLE 5

| | |
|---|---|
| Formation condition of 211 | |
| Source gases | SiH$_4$: 20 cm$^3$/min (normal)<br>H$_2$: 80 cm$^3$/min (normal)<br>PH$_3$ (diluted to 2% with H$_2$): 30 cm$^3$/min (normal) |
| Substrate temperature | 300° C. |

TABLE 5-continued

| | |
|---|---|
| Pressure Formation condition of 212 | 133 Pa (1.0 Torr) |
| Source gases | SiF$_4$:H$_2$ = 1:3<br>Total flow rate is determined so as to control the residence time to be the values as shown in Table 6 |
| Substrate temperature | 350° C. |
| Pressure Formation condition of 213 | 1,000 Pa (7.5 Torr) |
| Source gases | SiH$_4$: 10 cm$^3$/min (normal)<br>H$_2$: 800 cm$^3$/min (normal)<br>BF$_3$ (diluted to 2% with H$_2$): 100 cm$^3$/min (normal) |
| Substrate temperature | 200° C. |
| Pressure | 160 Pa (1.2 Torr) |

TABLE 6

| | | | | | | | |
|---|---|---|---|---|---|---|---|
| Residence time (second) in semiconductor formation vacuum vessel 212 | 0.008 | 0.01 | 0.1 | 1.0 | 3.0 | 10 | 15 |
| Photoelectric conversion efficiency | 1 | 1.5 | 1.5 | 1.6 | 1.5 | 1.3 | 0.8 |
| Peeling test | B | A | AA | AA | AA | A | C |
| Temperature-humidity test | 0.7 | 0.9 | 1.0 | 1.0 | 1.0 | 1.0 | 0.7 |

The values of photoelectric conversion efficiency are relative values calculated by standardizing the values obtained in the case the residence time in the semiconductor formation vacuum vessel 218 is 0.08 seconds to be 1. The symbols of the peeling test respectively means as follows: AA: 0, A: 1 to 2; B: 3 to 10; C: 10 to 100 of the number of peeled squares. The value of the temperature-humidity test shows (photoelectric conversion efficiency after the test)/(photoelectric conversion efficiency before the test).

TABLE 7

| | |
|---|---|
| Formation condition of 211 | |
| Source gases | SiH$_4$: 20 cm$^3$/min (normal)<br>H$_2$: 80 cm$^3$/min (normal)<br>PH$_3$ (diluted to 2% with H$_2$): 30 cm$^3$/min (normal) |
| Substrate temperature | 300° C. |
| Pressure Formation condition of 212 | 133 Pa (1.0 Torr) |
| Source gases | SiF$_4$:H$_2$ = 1:3<br>SiH$_4$ is added in the conditions shown in Table 8<br>τ = 1.0 second |
| Substrate temperature | 350° C. |
| Pressure Formation condition of 213 | 1,000 Pa (7.5 Torr) |
| Source gases | SiH$_4$: 10 cm$^3$/min (normal)<br>H$_2$: 800 cm$^3$/min (normal)<br>BF$_3$ (diluted to 2% with H$_2$): 100 cm$^3$/min (normal) |
| Substrate temperature | 200° C. |
| Pressure | 160 Pa (1.2 Torr) |

TABLE 8

| | | | | | | | |
|---|---|---|---|---|---|---|---|
| SiH$_4$ flow rate ratio | 0 | 0.01 | 0.1 | 0.2 | 0.3 | 0.5 | 1.0 |
| Luminous intensity ratio (440 nm/656 nm) | 15 | 10 | 8 | 3 | 1 | 0.9 | 0.7 |
| Photoelectric conversion efficiency | 1 | 1.1 | 0.9 | 1.0 | 0.95 | 0.85 | 0.8 |

The values of SiH$_4$ flow rate ratio are relative values to the SiF$_4$ flow rate assumed to be 1. The values of photoelectric conversion efficiency are relative values of photoelectric conversion efficiency in the case of the SiH$_4$ flow rate being 0 which is assumed to be 1.

TABLE 9

| | |
|---|---|
| Formation condition of 211 | |
| Source gases | SiH$_4$: 20 cm$^3$/min (normal)<br>H$_2$: 80 cm$^3$/min (normal)<br>PH$_3$ (diluted to 2% with H$_2$): 30 cm$^3$/min (normal) |
| Substrate temperature | 300° C. |
| Pressure Formation condition of 212 | 133 Pa (1.0 Torr) |
| Source gases | SiF$_4$:SiH$_4$:H$_2$ = 5:1:10<br>τ = 0.3 seconds |
| Substrate temperature | 350° C. |
| Pressure Formation condition of 213 | 1,000 Pa (7.5 Torr) |
| Source gases | SiH$_4$: 10 cm$^3$/min (normal)<br>H$_2$: 800 cm$^3$/min (normal)<br>BF$_3$ (diluted to 2% with H$_2$): 100 cm$^3$/min (normal) |
| Substrate temperature | 200° C. |
| Pressure | 160 Pa (1.2 Torr) |

TABLE 10

| | | | | | | | |
|---|---|---|---|---|---|---|---|
| High frequency density (W/cm$^3$) | 0.03 | 0.05 | 0.1 | 0.5 | 1.0 | 2.0 | 3.0 |
| Luminous intensity ratio (440 nm/656 nm) | 0.7 | 10 | 8 | 3 | 1 | 0.9 | 0.7 |
| Photoelectric conversion efficiency | 1 | 1.4 | 1.5 | 1.4 | 1.3 | 1.2 | 0.95 |

The values of high frequency density are A/B values where A (W) denotes the introduced power of the high frequency and B (cm$^3$) denotes the product of the surface area of the high frequency introduction part and the distance between the high frequency introduction part and the substrate. The values of photoelectric conversion efficiency are relative values of photoelectric conversion efficiency in the case of the high frequency density being 0.03 which is assumed to be 1.

TABLE 11

| Formation condition of 211 | |
|---|---|
| Source gases | SiH$_4$: 20 cm$^3$/min (normal)<br>H$_2$: 80 cm$^3$/min (normal)<br>PH$_3$ (diluted to 2% with H$_2$): 30 cm$^3$/min (normal) |
| Substrate temperature | 300° C. |
| Pressure | 133 Pa (1.0 Torr) |
| Formation condition of 212 | |
| Source gases | SiF$_4$:H$_2$ = 1:3<br>τ = 1.0 second |
| Substrate temperature | 350° C. |
| Pressure | 1,000 Pa (7.5 Torr) |
| Formation condition of 213 | |
| Source gases | SiH$_4$: 10 cm$^3$/min (normal)<br>H$_2$: 800 cm$^3$/min (normal)<br>BF$_3$ (diluted to 2% with H$_2$): 100 cm$^3$/min (normal) |
| Substrate temperature | 200° C. |
| Pressure | 160 Pa (1.2 Torr) |
| Formation condition of 214 | |
| Source gases | SiH$_4$: 20 cm$^3$/min (normal)<br>H$_2$: 100 cm$^3$/min (normal)<br>PH$_3$ (diluted to 2% with H$_2$): 50 cm$^3$/min (normal) |
| Substrate temperature | 300° C. |
| Pressure | 133 Pa (1.0 Torr) |
| Formation condition of 215 | |
| Source gases | SiH$_4$: 300 cm$^3$/min (normal)<br>H$_2$: 4,000 cm$^3$/min (normal) |
| Substrate temperature | 300° C. |
| Pressure | 1,500 Pa (11.3 Torr) |
| Formation condition of 216 | |
| Source gases | SiH$_4$: 10 cm$^3$/min (normal)<br>H$_2$: 800 cm$^3$/min (normal)<br>BF$_3$ (diluted to 2% with H$_2$): 100 cm$^3$/min (normal) |
| Substrate temperature | 200° C. |
| Pressure | 160 Pa (1.2 Torr) |

What is claimed is:

1. A method of forming a silicon-based thin film, said method comprising:
  introducing a source gas into a vacuum vessel, the source gas containing silicon fluoride and hydrogen; and
  forming a silicon-based thin film on a substrate introduced into the vacuum vessel by using a high frequency plasma CVD method,
  wherein a luminous intensity of generated plasma is set such that a luminous intensity attributed to SiFα (440 nm) is not smaller than a luminous intensity attributed to Hα (656 nm), and
  wherein a pressure in a discharge space is 90 Pa (0.68 Torr) or more but 1.5×10$^4$ Pa(113 Torr) or less.

2. The method of forming a silicon-based thin film according to claim 1, wherein the substrate is arranged opposite to a high frequency introduction part and a distance between the high frequency introduction part and the substrate is 3 mm or more and 30 mm or less.

3. A method of forming a silicon-based thin film, said method comprising:
  introducing a source gas into a vacuum vessel, the source gas containing silicon fluoride and hydrogen; and
  forming a silicon-based thin film on a substrate introduced into the vacuum vessel by a high frequency plasma CVD method,
  wherein a luminous intensity of generated plasma is set such that a luminous intensity attributed to SiFα (440 nm) is not smaller than a luminous intensity attributed to Hα (656 nm), and
  wherein a residence time τ defined as τ=592×V×P/Q is 0.01 seconds or more but 10 seconds or less, where V (m$^3$) denotes a volume of the discharge space in which the plasma is generated; Q (cm$^3$/min) denotes a flow rate of the source gas; and P (Pa) denotes the pressure in the discharge space wherein the pressure in the discharge space is 90 Pa (0.68 Torr) or more but l1.5×10$^4$ Pa (113 Torr) or less.

4. The method of forming a silicon-based thin film according to claim 1, wherein high frequency density A/B value is in a range from 0.05 to 2 W/cm$^3$, where A (W) denotes an introducing power of high frequency and B (cm$^3$) denotes a product of a surface area of the high frequency introduction part and a distance between the high frequency introduction part and the substrate.

5. The method of forming a silicon-based thin film according to claim 1, wherein the distance between the substrate and the high frequency introduction part is made changeable.

6. The method of forming a silicon-based thin film according to claim 1, wherein the luminous intensity of the plasma is adjusted so as to keep the luminous intensity attributed to SiFα (440 nm) and the luminous intensity attributed to Hα (656 nm) in a predetermined intensity ratio.

7. The method of forming a silicon-based thin film according to claim 1, wherein the source gas contains a silicon hydride compound.

8. The method of forming a silicon-based thin film according to claim 3, wherein the substrate is arranged opposite to a high frequency introduction part and a distance between the high frequency introduction part and the substrate is 3 mm or more and 30 mm or less.

9. The method of forming a silicon-based thin film according to claim 3, wherein high frequency density A/B value is in a range from 0.05 to 2 W/cm$^3$, where A (W) denotes an introducing power of high frequency and B (cm$^3$) denotes a product of a surface area of the high frequency introduction part and a distance between the high frequency introduction part and the substrate.

10. The method of forming a silicon-based thin film according to claim 3, wherein the distance between the substrate and the high frequency introduction part is made changeable.

11. The method of forming a silicon-based thin film according to claim 3, wherein the luminous intensity of the plasma is adjusted so as to keep the luminous intensity attributed to SiFα (440 nm) and the luminous intensity attributed to Hα (656 nm) in a predetermined intensity ratio.

12. The method of forming a silicon-based thin film according to claim 3, wherein the source gas contains a silicon hydride compound.

* * * * *

UNITED STATES PATENT AND TRADEMARK OFFICE
CERTIFICATE OF CORRECTION

PATENT NO. : 7,074,641 B2
APPLICATION NO. : 10/101859
DATED : July 11, 2006
INVENTOR(S) : Takaharu Kondo et al.

It is certified that error appears in the above-identified patent and that said Letters Patent is hereby corrected as shown below:

COLUMN 2:
Line 57, "se" should read -- set --; and
Line 64, "junction" should read -- junctions --.

COLUMN 4:
Line 6, "introduce" should read -- introduced --;
Line 30, "junction" should read -- junctions --;
Line 41, "thickness is" should read -- thickness has --.

COLUMN 5:
Line 50, "causes" should read -- a cause --.

COLUMN 6:
Line 45, "grin" should read -- grain --.

COLUMN 8:
Line 56, "elognat" should read -- elongated --.

COLUMN 9:
Line 38, "20 litter," should read -- 20 liters, --.

COLUMN 11:
Line 11, "junction" should read -- junctions --;
Line 28, "keep" should read -- keeping --; and
Line 32, "being" should read -- is being --.

COLUMN 13:
Line 9, "denotes" should read -- denote --.

COLUMN 14:
Line 29, "system" should read -- system was --.

COLUMN 15:
Line 34, "system" should read -- system was --.

COLUMN 16:
Line 61, "system" should read -- system was --.

COLUMN 18:
Line 50, "system" should read --system was --.

UNITED STATES PATENT AND TRADEMARK OFFICE
CERTIFICATE OF CORRECTION

PATENT NO. : 7,074,641 B2
APPLICATION NO. : 10/101859
DATED : July 11, 2006
INVENTOR(S) : Takaharu Kondo et al.

It is certified that error appears in the above-identified patent and that said Letters Patent is hereby corrected as shown below:

COLUMN 20:
Line 9, "time" should read -- time was --; and
Line 38, "system" should read -- system was --.

COLUMN 22:
Line 1, "system" should read -- system was --; and
Line 50, "density" should read -- density was --.

COLUMN 23:
Line 33, "system" should read -- system was --.

COLUMN 24:
Line 16, "density" should read -- density was --;
Line 44, "pair" should read -- pair of --; and
Line 45, "junction" should read -- junctions --.

COLLUMN 30:
Line 33, "space" should read -- space, --.

Signed and Sealed this

Twenty-seventh Day of February, 2007

JON W. DUDAS
*Director of the United States Patent and Trademark Office*